(12) United States Patent
Li et al.

(10) Patent No.: US 12,159,034 B2
(45) Date of Patent: Dec. 3, 2024

(54) METHOD AND APPARATUS FOR DETECTING MARGINS OF DATA SIGNAL AND STORAGE DEVICE

(71) Applicant: HUAWEI TECHNOLOGIES CO., LTD., Guangdong (CN)

(72) Inventors: Yongyao Li, Shenzhen (CN); Guoyu Wang, Chengdu (CN); Jun Yu, Chengdu (CN); You Li, Chengdu (CN); Jiawu Liu, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 206 days.

(21) Appl. No.: 17/746,652

(22) Filed: May 17, 2022

(65) Prior Publication Data

US 2022/0276788 A1    Sep. 1, 2022

Related U.S. Application Data

(63) Continuation of application No. PCT/CN2020/097788, filed on Jun. 23, 2020.

(30) Foreign Application Priority Data

Nov. 18, 2019 (CN) .......................... 201911128368.5

(51) Int. Cl.
*G06F 3/06* (2006.01)
*G11C 5/14* (2006.01)
(Continued)

(52) U.S. Cl.
CPC .......... *G06F 3/0611* (2013.01); *G06F 3/0655* (2013.01); *G06F 3/0679* (2013.01);
(Continued)

(58) Field of Classification Search
CPC .... G06F 3/0611; G06F 3/0655; G06F 3/0679; G06F 13/1689; G11C 5/147;
(Continued)

(56) References Cited

U.S. PATENT DOCUMENTS 9,665,289 B1 * 5/2017 Mach ................. G11C 29/1201
2004/0123207 A1 * 6/2004 Zumkehr ............. G11C 7/1066
714/744

(Continued)

FOREIGN PATENT DOCUMENTS

| CN | 103941788 A | 7/2014 |
| CN | 105701042 A | 6/2016 |

(Continued)

*Primary Examiner* — Donald H B Braswell
(74) *Attorney, Agent, or Firm* — WOMBLE BOND DICKINSON (US) LLP

(57) ABSTRACT

This application provides a method for detecting margins of a data signal. A receive end of a data signal may adjust a voltage of a reference power source; adjust, based on a plurality of reference moments included in a reference moment set, a moment of an edge of a data strobe signal transmitted by a transmit end of the data signal; and during the adjustment, for each reference voltage and each reference moment, determine whether a bit error exists in data obtained by decoding the data signal when the voltage of the reference power source is the reference voltage and the moment of the edge of the data strobe signal is the reference moment, to obtain a timing margin of the data signal at each reference voltage and a voltage margin of the data signal at each reference moment.

20 Claims, 18 Drawing Sheets

(51) Int. Cl.
*G11C 7/10* (2006.01)
*G11C 7/22* (2006.01)
*G11C 11/4076* (2006.01)
*G11C 29/02* (2006.01)

(52) U.S. Cl.
CPC .......... *G11C 5/147* (2013.01); *G11C 7/1093* (2013.01); *G11C 7/222* (2013.01); *G11C 11/4076* (2013.01); *G11C 29/021* (2013.01); *G11C 29/023* (2013.01); *G11C 29/028* (2013.01); *G11C 2207/2254* (2013.01)

(58) Field of Classification Search
CPC ..... G11C 7/222; G11C 29/021; G11C 29/023; G11C 29/028; G11C 2207/2254; G11C 29/022; G11C 29/50; G11C 2029/5004; Y02D 10/00
See application file for complete search history.

(56) References Cited

U.S. PATENT DOCUMENTS

| | | | |
|---|---|---|---|
| 2009/0103379 | A1 | 4/2009 | Zhang et al. |
| 2011/0286288 | A1 | 11/2011 | Mutnury et al. |
| 2013/0249612 | A1* | 9/2013 | Zerbe .................. H04L 7/0079 327/161 |
| 2017/0323222 | A1 | 11/2017 | Rao et al. |
| 2019/0273640 | A1 | 9/2019 | Lin et al. |
| 2020/0076652 | A1* | 3/2020 | Shi .................... G06F 13/1689 |

FOREIGN PATENT DOCUMENTS

| | | |
|---|---|---|
| CN | 108646984 A | 10/2018 |
| CN | 108763115 A | 11/2018 |
| CN | 108922570 A | 11/2018 |
| CN | 110223722 A | 9/2019 |
| WO | 2018014024 A1 | 1/2018 |

* cited by examiner

FIG. 17

METHOD AND APPARATUS FOR DETECTING MARGINS OF DATA SIGNAL AND STORAGE DEVICE

CROSS-REFERENCE TO RELATED APPLICATIONS

This application is a continuation of International Application No. PCT/CN2020/097788, filed on Jun. 23, 2020, which claims priority to Chinese Patent Application No. 201911128368.5, filed on Nov. 18, 2019. The disclosures of the aforementioned applications are hereby incorporated by reference in their entireties.

TECHNICAL FIELD

This application relates to the field of communications technologies, and in particular, to a method and an apparatus for detecting margins of a data signal and a storage device.

BACKGROUND

A storage device generally includes a storage controller and a non-volatile flash memory (NAND flash) medium. The storage controller is connected to the nand flash medium by using a non-volatile flash memory interface (NAND flash Interface, NFI), and can write data to the nand flash medium or read data from the nand flash medium by using the NFI bus. When the storage controller writes data to the nand flash medium, the storage controller is a transmit end of the data, and the nand flash medium is a receive end of the data. When the storage controller reads data from the nand flash medium, the nand flash medium is a transmit end of the data, and the storage controller is a receive end of the data.

In a process of reading or writing data, a transmit end of the data transmits a data signal (DQ) and a data strobe signal (DQS) to a receive end by using the NFI bus. The receive end of the data may sample the DQ at an edge of the DQS, and decide, based on a reference voltage (also referred to as a decision level) provided by a reference power source, a voltage obtained by sampling the DQ, to obtain the data by decoding. To ensure that the receive end can correctly sample the DQ, the edge of the DQS transmitted by the transmit end needs to be aligned with an edge or a central position of the DQ. However, as a data transmission rate of the NFI bus is continuously increased, a DQS cycle and a DQ cycle are shortened. After the DQS and the DQ are transmitted to the receive end by using the NFI bus, a deviation of the edge of the DQS has relatively great impact on DQ sampling accuracy. Consequently, when the storage controller reads or writes the data, a bit error easily occurs.

In the related art, a signal eye pattern of the DQ received by the receive end is generally tested by using an afterglow test function of an oscilloscope, and then a timing margin of the DQ is measured based on the eye pattern, where the timing margin is a time range within which the DQ remains valid at the receive end in each cycle. In an embodiment, when a moment of the edge of the DQS is within the range of the timing margin, it may be ensured that the DQ can be correctly decoded. Then a developer may calibrate a related parameter of the storage device (for example, a timing of the DQS or a reference voltage) based on the timing margin of the DQ obtained through measurement, to ensure reliability of data reading or writing of the storage controller. However, efficiency of measuring the timing margin of the DQ based on the signal eye pattern obtained through the test by using the oscilloscope is relatively low.

SUMMARY

This application provides a method and an apparatus for detecting margins of a DQ and a storage device, to resolve a problem in the related art that efficiency of detecting a timing margin by using an oscilloscope is relatively low. The technical solutions are as follows:

According to an embodiment, a method for detecting margins of a DQ is provided and applied to a receive end of the DQ. The method may include the following operations: adjusting a voltage of a reference power source based on a plurality of reference voltages included in a reference voltage set; adjusting, based on a plurality of reference moments included in a reference moment set, a moment of an edge of a DQS transmitted by a transmit end of the DQ; and in an adjustment process, for each reference voltage and each reference moment, determining whether a bit error exists in data obtained by decoding the DQ when the voltage of the reference power source is the reference voltage and the moment of the edge of the DQS is the reference moment, to obtain a timing margin of the DQ at each reference voltage and a voltage margin of the DQ at each reference moment, where the timing margin is a range of reference moments that enable the data obtained by decoding to be free of bit errors, in the plurality of reference moments, and the voltage margin is a range of reference voltages that enable the data obtained by decoding to be free of bit errors, in the plurality of reference voltages.

In the method provided by this application, the receive end of the DQ may automatically detect the timing margin and voltage margin of the DQ by adjusting the voltage of the reference power source and a timing of the DQS. Because no other external detection device needs to be connected in the detection process, detection efficiency is effectively improved.

In an embodiment, the receive end may include a register and a bleeder circuit, a control end of the bleeder circuit is connected to the register, and an output end of the bleeder circuit is connected to the reference power source; and the receive end may adjust a value of the register, to adjust an output voltage of the bleeder circuit.

Because the bleeder circuit connected to the reference power source is disposed at the receive end of the DQ, the voltage of the reference power source can be flexibly adjusted, and timing margins of the DQ at different reference voltages can be detected conveniently.

In an embodiment, the receive end may further include a delay line, and the delay line is connected to a latch used for latching the data strobe signal and to an input/output interface of the receive end separately; and the receive end may adjust a parameter of the delay line, to adjust the moment of the edge of the DQS transmitted by the transmit end of the DQ.

Because the delay line is disposed at the receive end of the DQ, the timing of the DQS can be flexibly adjusted.

In an embodiment, the process of detecting a timing margin of the DQ at each reference voltage and a voltage margin of the DQ at each reference moment may include:

adjusting the voltage of the reference power source to one reference voltage in the reference voltage set; within a range of the plurality of reference moments included in the reference moment set, adjusting the moment of the edge of the DQS transmitted by the transmit end, and detecting whether a bit error exists in data obtained by decoding the DQ based on the current reference voltage and the DQS after the adjustment, to determine a start boundary moment and an end boundary moment of the timing margin of the DQ separately from the plurality of reference moments; and repeating the operations of adjusting the voltage and determining the timing margin, until the voltage of the reference power source traverses the reference voltage set, where the start boundary moment is an earliest reference moment that enables the data obtained by decoding to be free of bit errors, in the plurality of reference moments, and the end boundary moment is a latest reference moment that enables the data obtained by decoding to be free of bit errors, in the plurality of reference moments.

In an embodiment of the application, the voltage of the reference power source may be first fixed to a reference voltage, and the timing of the DQS is adjusted, so that the timing margin at each reference voltage is obtained.

In an embodiment, the plurality of reference moments may be arranged in ascending order, and the process of determining a start boundary moment of the timing margin of the DQ may include:
adjusting the moment of the edge of the DQS transmitted by the transmit end, to a first target reference moment in the plurality of reference moments, where the first target reference moment is an $X^{th}$ reference moment in the plurality of reference moments, X is a positive integer less than M/2, and M is a total quantity of reference moments included in the reference moment set; detecting whether a bit error exists in data obtained by decoding the DQ based on the current reference voltage and the DQS after the adjustment; if any bit error exists, setting forward the moment of the edge of the DQS by a first step length, until no bit error exists in data obtained by decoding based on the current reference voltage and the DQS after the adjustment; setting back the moment of the edge of the DQS by a second step length, until a bit error exists in data obtained by decoding based on the current reference voltage and the DQS after the adjustment; and determining a reference moment next to the moment of the edge of the DQS after the adjustment as the start boundary moment of the timing margin of the DQ, where the second step length is equal to a time difference between two adjacent reference moments, and the first step length is greater than the second step length and is an integer multiple of the second step length.

In the process of determining the start boundary moment, the timing of the DQS is first coarsely adjusted by using the relatively great first step length, and then the timing of the DQS is finely adjusted by using the relatively small second step length. This can effectively improve efficiency of determining the start boundary moment.

In an embodiment, the process of determining an end boundary moment of the timing margin of the DQ may include:
adjusting the moment of the edge of the DQS transmitted by the transmit end, to a second target reference moment in the plurality of reference moments, where the second target reference moment is a $Y^{th}$ reference moment in the plurality of reference moments, Y is a positive integer greater than M/2, and M is a total quantity of reference moments included in the reference moment set; detecting whether a bit error exists in data obtained by decoding the DQ based on the current reference voltage and the DQS after the adjustment; if any bit error exists, setting back the moment of the edge of the DQS by a first step length, until no bit error exists in data obtained by decoding based on the current reference voltage and the DQS after the adjustment; setting forward the moment of the edge of the DQS by a second step length, until a bit error exists in data obtained by decoding based on the current reference voltage and the DQS after the adjustment; and determining a reference moment previous to the moment of the edge of the DQS after the adjustment as the end boundary moment of the timing margin of the DQ, where the second step length is equal to a time difference between two adjacent reference moments, and the first step length is greater than the second step length and is an integer multiple of the second step length.

In the process of determining the end boundary moment, the timing of the DQS is first coarsely adjusted by using the relatively great first step length, and then the timing of the DQS is finely adjusted by using the relatively small second step length. This can effectively improve efficiency of determining the end boundary moment.

In an embodiment, the process of detecting a timing margin of the DQ at each reference voltage and a voltage margin of the DQ at each reference moment may include:
adjusting the moment of the edge of the DQS transmitted by the transmit end of the DQ, to one reference moment in the plurality of reference moments; within a range of the plurality of reference voltages included in the reference voltage set, adjusting the voltage of the reference power source, and detecting whether a bit error exists in data obtained by decoding the DQ based on the current reference moment and the voltage of the reference power source after the adjustment, to determine a start boundary voltage and an end boundary voltage of the voltage margin of the DQ separately from the plurality of reference voltages; and repeating the operations of adjusting the moment and determining the voltage margin, until the moment of the edge of the DQS traverses the reference moment set, where the start boundary voltage is a lowest reference voltage that enables the data obtained by decoding to be free of bit errors, in the plurality of reference voltages, and the end boundary voltage is a highest reference voltage that enables the data obtained by decoding to be free of bit errors, in the plurality of reference voltages.

In an embodiment of the application, the moment of the edge of the DQS may be first fixed to a reference moment, and the voltage of the reference power source is adjusted, so that the voltage margin at each reference moment is obtained.

In an embodiment, the receive end may be a storage controller, the transmit end may be a storage medium, and the storage controller may be connected to the storage medium by using an interface bus; and before the adjusting a moment of an edge of a DQS transmitted by a transmit end of the DQ, the method may further include:
writing test data to the storage medium at a target rate; transmitting, to the storage medium, an instruction for reading the test data; and receiving the DQ carrying the test data, and the DQS that are transmitted by the storage medium, where the target rate is a working rate of the interface bus or is a lower limit rate within a bus rate range corresponding to a working mode of the interface bus.

In an embodiment of the application, if the storage controller needs to detect margins of a read DQ, the target rate may be the lower limit rate within the bus rate range corresponding to the working mode of the interface bus. Writing test data at the lower limit rate can ensure that the test data can be correctly written to the storage medium, and can further ensure reliability of a detection result obtained by detecting the margins of the read DQ. If the storage controller needs to detect margins of a DQ written to the storage medium, the storage controller may write test data at a normal working rate, to ensure that a detection result can reflect an actual running status of a storage device.

In an embodiment, the process of adjusting a voltage of a reference power source based on a plurality of reference voltages included in a reference voltage set may include: adjusting the voltage of the reference power source in response to a detection instruction based on the plurality of reference voltages included in the reference voltage set; or if detecting that a physical parameter of a storage device meets a detection trigger condition, adjusting the voltage of the reference power source based on the plurality of reference voltages included in the reference voltage set.

In an embodiment of the application, when instructed by the detection instruction, the receive end of the DQ may trigger the procedure for detecting the margins of the DQ, or when detecting that the physical parameter meets the detection trigger condition, the receive end of the DQ may automatically trigger the procedure for detecting the margins of the DQ.

According to an embodiment, an apparatus for detecting margins of a data signal is provided. The apparatus includes one or more modules, and the one or more modules may be configured to implement the method for detecting margins of a DQ according to the foregoing aspect.

According to an embodiment, an apparatus for detecting margins of a data signal is provided. The apparatus includes a memory, a processor, and a computer program stored in the memory and capable of running on the processor, and when the processor executes the computer program, the method for detecting margins of a DQ according to the foregoing aspect is implemented.

According to an embodiment, a non-volatile storage medium is provided. The non-volatile storage medium stores an instruction, and when the non-volatile storage medium runs on a processor, the processor is enabled to perform the method for detecting margins of a DQ according to the foregoing aspect.

According to an embodiment, a chip is provided. The chip includes a programmable logic circuit and/or a program instruction, and when the chip runs, the chip is configured to implement the method for detecting margins of a DQ according to the foregoing aspect.

According to an embodiment, a computer program product including an instruction is provided. When the computer program product runs on a processor, the processor is enabled to perform the method for detecting margins of a DQ according to the foregoing aspect.

According to an embodiment, a storage device is provided. The storage device includes a storage controller and a storage medium, and the storage controller is connected to the storage medium by using an interface bus; and the storage controller and/or the storage medium include/includes the apparatus for detecting margins of a data signal or the chip according to the foregoing aspect.

According to the method and apparatus for detecting margins of a data signal and the storage device that are provided by the embodiments of this application, the receive end of the data signal may automatically detect the timing margin and voltage margin of the DQ by adjusting the voltage of the reference power source and the timing of the DQS. Because no other external detection device needs to be connected in the detection process, detection efficiency is effectively improved. In addition, because the timing margin and the voltage margin are determined by the receive end of the data signal based on whether a bit error exists in data actually obtained by decoding, reliability of the detection result can be ensured.

BRIEF DESCRIPTION OF DRAWINGS

FIG. 17 is another schematic diagram of two-dimensional margins of a DQ according to an embodiment of this application;

DESCRIPTION OF EMBODIMENTS

With reference to the accompanying drawings, the following describes in detail a method and an apparatus for detecting margins of a data signal and a storage device provided by embodiments of this application.

Figure 1:
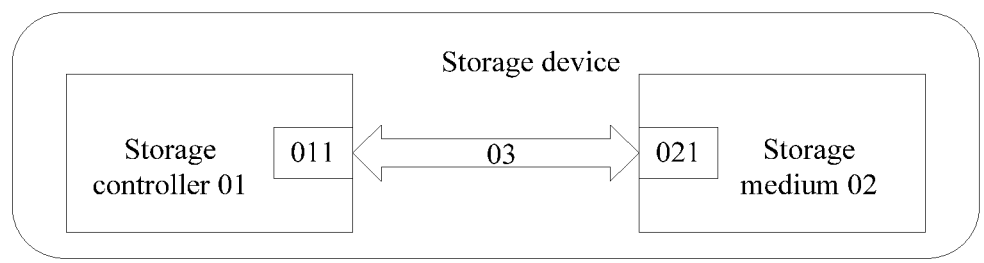
FIG. 1 is a schematic structural diagram of a storage device according to an embodiment of this application.

FIG. 1 is a schematic structural diagram of a storage device according to an embodiment of this application. As shown in FIG. 1, the storage device may include a storage controller 01 and one or more storage media 02. For example, FIG. 1 shows only one storage medium 02. Each storage medium 02 may be a nand flash medium, which may also be referred to as a nand flash chip or a nand flash memory chip. The nand flash medium has advantages such as a large capacity and a high reading/writing speed, and is applicable to mass data storage. A plurality of input/output (I/O) interfaces 011 may be disposed in the storage controller 01. One I/O interface 021 is also disposed in each storage medium 02. The I/O interface 021 of each storage medium 02 may be connected to one I/O interface 011 of the storage controller 01 by using an NFI bus 03.

In an embodiment, the storage device may be solid state drives (SSD) of different sizes, an add-in card (AIC) device, a mini serial advanced technology attachment (mSATA) interface solid state drive, a next generation form factor (NGFF), another customized card, or the like.

In an embodiment of the application, the NFI bus 03 may include a plurality of data lines, where each data line may be configured to transmit one DQ, and the plurality of data lines may transmit a plurality of DQs in parallel. For example, the NFI bus 03 may include eight data lines, where the eight data lines may transmit eight DQs in parallel: a DQ 0 to a DQ 7.

Figure 2:
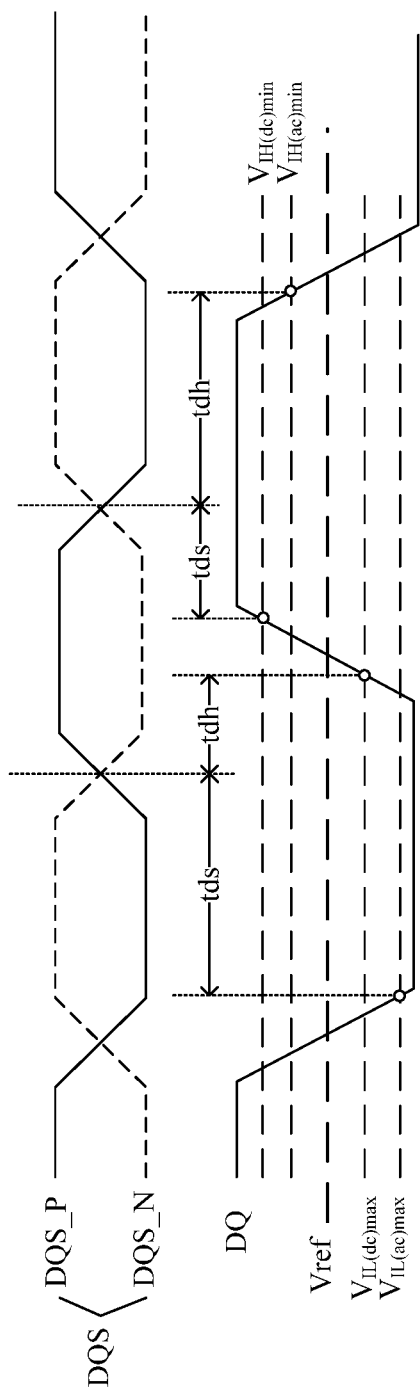
FIG. 2 is a timing diagram of a DQS and a DQ according to an embodiment of this application.

FIG. 2 is a timing diagram of a DQS and a DQ according to an embodiment of this application. As can be seen with reference to FIG. 2, the DQS is a differential signal, and the DQS includes two signals: a DQS_P and a DQS_N. After a receive end receives a DQS and a DQ carrying data that are transmitted by a transmit end, the receive end may sample the DQ at an edge of the DQS, and may compare a voltage obtained by decoding with a reference voltage Vref provided by a reference power source VREF. If the voltage obtained by sampling the DQ is higher than the reference voltage Vref, it may be determined that the received data is 1; or if the voltage obtained by sampling the DQ is lower than the reference voltage Vref, it may be determined that the received data is 0. In this way, the DQ is decoded. The edge of the DQS may be a rising edge or a falling edge of the DQS.

To ensure that the receive end can correctly sample the DQ based on the DQS, as shown in FIG. 2, it needs to be ensured that the DQ arrives at the receive end before the edge of the DQS arrives, and remains stable at the receive end for a period of time after the edge of the DQS arrives. Duration tds within which the DQ remains valid at the receive end before the edge of the DQS arrives may be referred to as setup time. Duration tdh within which the DQ is held valid at the receive end after the edge of the DQS arrives may be referred to as hold time. For a low-level DQ, when a voltage of the DQ received by the receive end is less than or equal to VIL(ac)max, it may be determined that the DQ is valid, or when a voltage of the DQ is greater than VIL(dc)max, it may be determined that the DQ is invalid. For a high-level DQ, when a voltage of the DQ received by the receive end is greater than or equal to VIH(ac)min, it may be determined that the DQ is valid, or when a voltage of the DQ is less than VIH(ac)min, it may be determined that the DQ is invalid. VIL(ac)max, VIL(dc)max, VIH(dc)min, and VIH(ac)min are all threshold voltages specified by a protocol.

In an embodiment of the application, a time range within which the DQ is held valid at the receive end after arriving at the receive end is referred to as a timing margin of the DQ, and the timing margin may also be referred to as a valid width of the DQ or a length of a valid window. When a moment of the edge of the DQS changes within the timing margin, correct decoding of the DQ can be ensured. As can be seen with reference to FIG. 2, the timing margin may be a sum of the setup time and the hold time. In addition, in an embodiment of the application, a change range of a reference voltage that can ensure correct decoding of the DQ is referred to as a voltage margin of the DQ. In an embodiment, adjusting the voltage of the reference power source VREF within the voltage margin can ensure correct decoding of the DQ.

When the storage controller 01 reads data from the storage medium 02, that is, when the storage controller 01 serves as a receive end, a DQS is generated by the storage medium 02, and an edge of the DQS is aligned with an edge of a DQ, to ensure that the storage controller 01 can effectively read the data transmitted by the storage medium 02. When the storage controller 01 writes data to the storage medium 02, that is, when the storage medium 02 serves as a receive end, a DQS is generated by the storage controller 01, and an edge of the DQS is aligned with a central position of a DQ, to ensure that the storage medium 02 can effectively store the data written by the storage controller 01. An operation of writing data by the storage controller 01 to the storage medium 02 may also be referred to as a write operation or an operation in a write direction. An operation of reading data by the storage controller 01 from the storage medium 02 may also be referred to as a read operation or an operation in a read direction.

However, after a DQ and a DQS arrive at a receive end through a transmission link, their phases generally change greatly. For example, due to impact of environmental factors such as a process corner, voltage, and temperature (PVT), valid widths of DQs received by the receive end may be different, edges of the DQs are not aligned either, and an edge of the DQS is no longer aligned with an edge or a central position of the DQ. Consequently, the storage controller 01 cannot read or write data correctly. In addition, with continuous development of an information and communications technologies (ICT) industry, a customer has a higher requirement on input/output operations per second (IOPS) of the storage device. Because a data transmission rate of the NFI bus 03 between the storage controller 01 and the storage medium is a key factor affecting the IOPS, the data transmission rate of the NFI bus 03 is also continuously increased. As a result, the valid width of the DQ is further reduced, and a bit error occurs more easily when the storage controller 01 reads or writes data. Therefore, how to accurately test a timing margin and a voltage margin of the DQ transmitted by the NFI bus 03 and further ensure sufficient design margins of a whole link becomes a key to reliable application of the storage device.

In the related art, on one hand, signal eye patterns of the DQS and DQ received by the receive end are generally tested by using an afterglow test function of an oscilloscope, and then a timing margin and a voltage margin of the DQ are measured and determined. However, the test process requires plenty of time, human resources, and material resources, and test efficiency is relatively low. Therefore, project development costs are increased, and a project cycle is prolonged. Moreover, the test method can test only a signal waveform at a pin of the receive end, and cannot test a waveform of a signal actually received by a die of the receive end. Therefore, test accuracy is relatively low. In addition, in a scenario in which one storage medium 02 is attached to a front side of a card and one storage medium 02 is attached to a rear side of the card, when a test is performed by using the storage medium 02 as a receive end, one storage medium 02 on the card needs to be welded off. Consequently, load of a link under test is reduced, and a test result is inaccurate. In addition, usually, the test can be performed only on a single sample, and cannot cover samples having different process corners. It is possible that a nonconformity risk remains in subsequent thorough and qualification tests on a large quantity of samples, causing a problem such as lagging of risk interception or wasting of test resources.

On the other hand, values of the timing margin and the voltage margin of the DQ may be further determined by means of a bias test about whether uncorrectable (UNC) data error occurs. For example, parameters such as frequency, timing, temperature, and voltage may be biased for testing. However, in this method, the timing margin and the voltage margin are roughly estimated by using an indirect test method, and accurate quantization of the timing margin and the voltage margin cannot be implemented. Therefore, test accuracy is relatively low. In addition, in this method, test personnel are required to manually adjust test parameters, and plenty of time, human resources, and material resources are required in the test process. Therefore, test efficiency is relatively low, the project development costs are increased, and the project cycle is prolonged.

Figure 3:
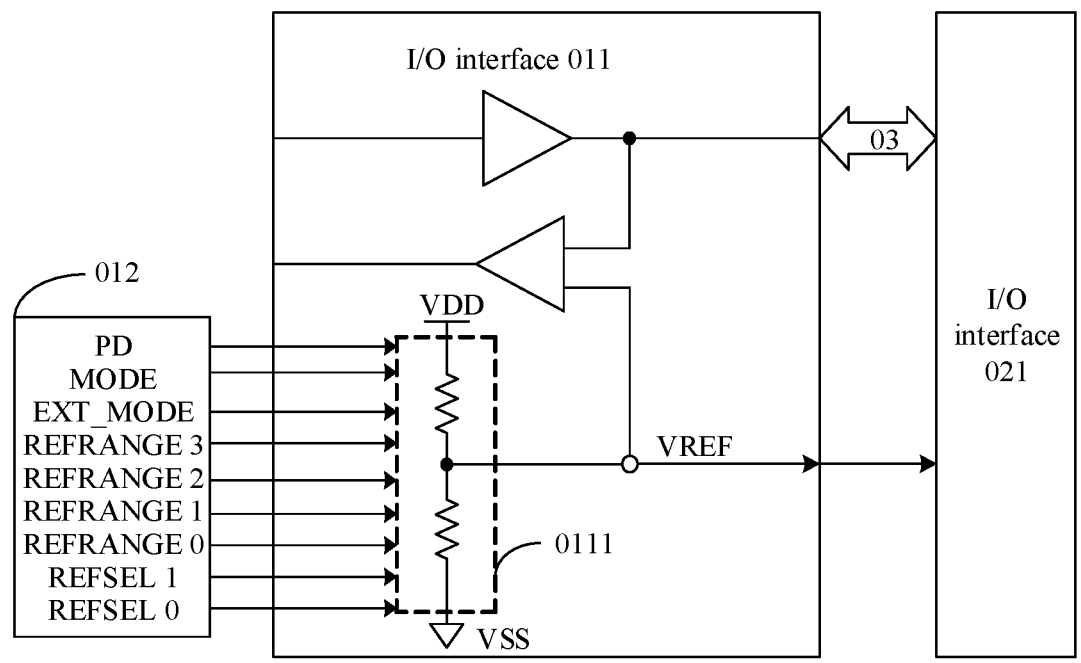
FIG. 3 is a schematic structural diagram of a storage controller according to an embodiment of this application.

Embodiments of this application provide a method and an apparatus for detecting margins of a DQ and a storage device. A receive end of a data signal in the storage device may automatically detect margins of the DQ, and detection efficiency and accuracy are both relatively high. The receive end may be a storage controller 01, or may be a storage medium 02. Assuming that the receive end is the storage controller 01, as shown in FIG. 3, a bleeder circuit 0111 may be disposed in an I/O interface 011 of the storage controller 01, and a register 012 may be further disposed in a physical layer of the storage controller 01. The bleeder circuit 0111 is connected to the register 012 and a reference power source VREF respectively, and the reference power source VREF is further connected to an I/O interface 021 of the storage medium 02. A reference voltage provided by the reference power source VREF may be used as a decision level when the storage controller 01 and the storage medium 02 decode received DQs.

A processing circuit (not shown in FIG. 3) in the storage controller 01 may configure a parameter of the register 012, to adjust a value of the register 012 and further adjust an output voltage of the bleeder circuit 0111. For example, referring to FIG. 3, the processing circuit may configure parameters such as REFSEL0, REFSEL1, REFRANGE0, REFRANGE1, REFRANGE2, and REFRANGE3 of the register 012, to adjust the value of the register 012. Because the bleeder circuit 0111 is added to the storage controller 01, the bleeder circuit 0111 may be used to flexibly adjust the voltage of the reference power source VREF, to detect a voltage margin of the DQ.

Figure 4:
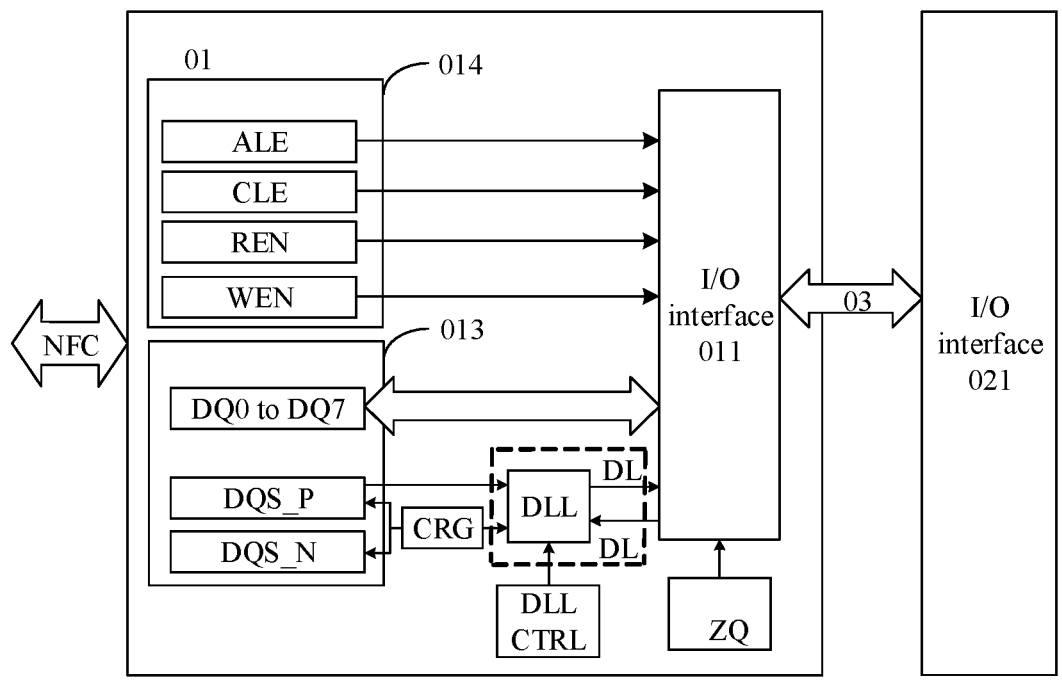
FIG. 4 is a schematic structural diagram of another storage controller according to an embodiment of this application.

FIG. 4 is a schematic structural diagram of a physical layer (PHY) of a storage controller according to an embodiment of this application. As shown in FIG. 4, a latch 013 used for latching a DQ and a DQS, a delay-locked loop (DLL), a delay line, and a DLL controller (DLL CTRL) may be further disposed in the storage controller 01. The DLL is connected to the latch 013, the DL, and the DLL CTRL respectively, and the DL is further connected to the I/O interface 011 of the storage controller. The DLL is configured to detect a cycle of the DQS under control of the DLL CTRL. The processing circuit in the storage controller 01 may determine, based on the cycle of the DQS detected by the DLL, a quantity of reference moments included in a reference moment set, and may divide the cycle of the DQS into a plurality of reference moments, that is, the processing circuit may determine the reference moment set based on the cycle of the DQS. The processing circuit may further adjust a timing of the DQS by adjusting a parameter of the DL, that is, adjust a moment of an edge of the DQS, to detect a timing margin of the DQ conveniently.

Referring to FIG. 4, the physical layer of the storage controller may be connected to the processing circuit by using a nand flash control (NFC) interface. A control link (CMDLANE) 014 may be further disposed in the storage controller 01. The control link 014 is configured to provide an address latch enable (ALE) signal, a command latch enable (CLE) signal, a read enable (REN) signal, a write enable (WEN) signal, and the like. The DLL may be connected to the latch 013 by using a clock reset generator (CRG). As shown in FIG. 4, a ZQ resistor is further disposed in the physical layer. After power-up or reset, the storage controller needs to perform a calibration operation on the ZQ resistor.

Figure 5:
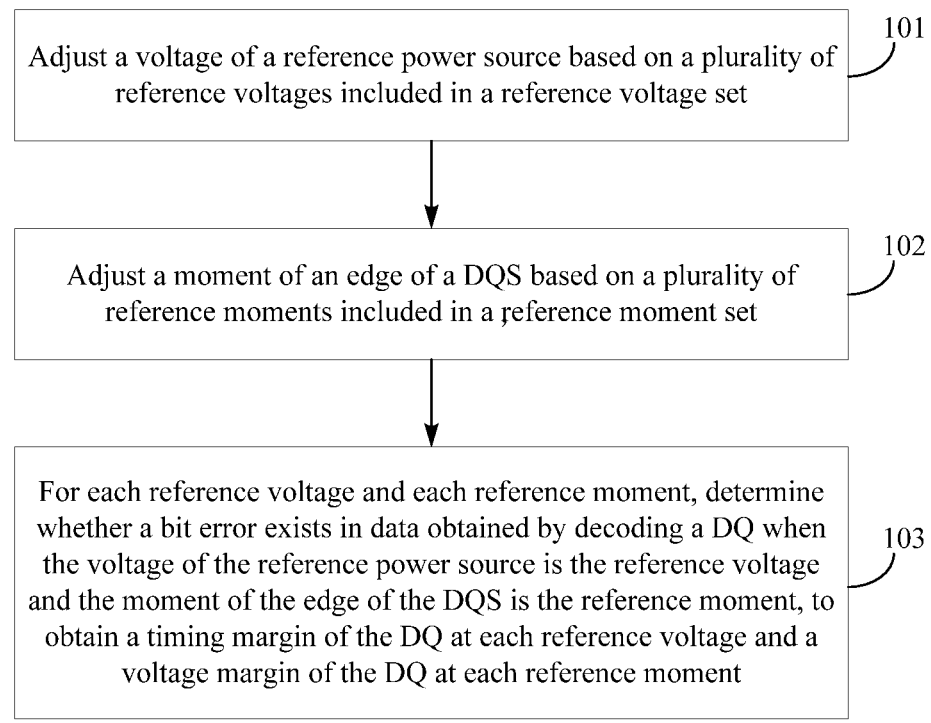
FIG. 5 is a flowchart of a method for detecting margins of a DQ according to an embodiment of this application.

FIG. 5 is a flowchart of a method for detecting margins of a DQ according to an embodiment of this application. This method may be applied to a receive end of a data signal in a storage device, for example, may be applied to a storage controller. In the following description, it is assumed that the method is applied to the storage controller. Referring to FIG. 5, the method may include the following operations.

Operation 101: Adjust a voltage of a reference power source based on a plurality of reference voltages included in a reference voltage set.

In an embodiment of the application, the storage controller may prestore a reference voltage set including a plurality of reference voltages, and the plurality of reference voltages may be to-be-detected voltages preconfigured by a developer.

In an embodiment, as shown in FIG. 3, the storage controller 01 may adjust a value of a register 012 by using a processing circuit, to adjust an output voltage of a bleeder circuit 0111, thereby adjusting a voltage of the reference power source VREF. For example, referring to FIG. 3, the bleeder circuit 0111 may be a resistor bleeder circuit, and the bleeder circuit 0111 may be equivalent to two resistors R1 and R2 that are connected in series between a first power source VDD and a second power source VSS, and the reference power source VREF may be connected to a connection point between the two resistors R1 and R2. The processing circuit may adjust the value of the register 012, to adjust a value of at least one of the two resistors R1 and R2. In this way, the output voltage output by the bleeder circuit 0111 to the reference power source VREF can be changed.

Operation 102: Adjust a moment of an edge of a DQS based on a plurality of reference moments included in a reference moment set.

The DQS is transmitted synchronously when a storage medium transmits a DQ to the storage controller. The storage controller may prestore a reference moment set including a plurality of reference moments, and the plurality of reference moments may be determined by the storage controller based on a cycle of a detected DQS or may be to-be-detected moments preconfigured by the developer. As shown in FIG. 4, the storage controller 01 may adjust, by using a DL, a timing of the DQS transmitted by the storage medium, so that the moment of the edge of the DQS is aligned with different reference moments. In an embodiment, the plurality of reference moments may be determined by dividing the cycle of the DQS into equal parts, where the cycle of the DQS is determined based on a data transmission rate of an NFI bus, and may be obtained through detection by using a DLL. For example, the storage controller may divide the cycle of the DQS into 1023 equal parts, thereby determining 1024 reference moments. Each reference moment may be indicated by using a scale value. For example, 1 to 1024 may be used to indicate the 1024 reference moments.

Operation 103: For each reference voltage and each reference moment, determine whether a bit error exists in data obtained by decoding the DQ when the voltage of the reference power source is the reference voltage and the moment of the edge of the DQS is the reference moment, to obtain a timing margin of the DQ at each reference voltage and a voltage margin of the DQ at each reference moment.

The timing margin is a range of reference moments that enable the data obtained by decoding to be free of bit errors, in the plurality of reference moments, and the voltage margin is a range of reference voltages that enable the data obtained by decoding to be free of bit errors, in the plurality of reference voltages. In an embodiment of the application, because the storage controller 01 can not only perform an operation in a read direction but also perform an operation in a write direction, the storage controller 01 can detect margins of a DQ in the read direction and margins of a DQ in the write direction separately. Certainly, if the storage medium 02 in the storage device also has a margin detection function, the storage medium 02 can also detect the margins of the DQ in the write direction.

When detecting the margins of the DQ in the read direction, the storage controller 01 may first write test data to the storage medium 02 at a relatively low data transmission rate, to ensure accuracy of the test data that is written. Then the storage controller 01 may transmit, to the storage medium, an instruction for reading the test data. Then the storage medium 02 may transmit, in response to the read instruction, the DQ carrying the test data, and the DQS to the storage controller 01. Then the storage controller 01 may detect the margins of the DQ in the read direction based on the DQS.

Before the storage controller 01 detects the margins of the DQ in the write direction, the storage controller 01 or the developer may first calibrate a related parameter (for example, a parameter of the DL or a voltage of the reference power source VREF) of the storage device based on a detection result of the margins of the DQ in the read direction, to ensure that the margins of the DQ in the read direction can ensure correct decoding of data, that is, ensure that the storage controller 01 can correctly read data. Then the storage controller 01 may write test data to the storage medium 02 at a normal data transmission rate, and transmit, to the storage medium 02, an instruction for reading the test data. The storage medium 02 may transmit, in response to the read instruction, the DQ carrying the test data, and the DQS to the storage controller 01. Then the storage controller 01 may detect the margins of the DQ based on the received DQS. Because it can be ensured that the test data read by the storage controller 01 is accurate, that is, the test data read by the storage controller 01 is the test data actually written to the storage medium 02, the storage controller 01 can detect, based on the DQ transmitted by the storage medium 02, the margins of the DQ (that is, the DQ in the write direction) transmitted by the storage controller 01 to the storage medium 02.

As described above, an embodiment of the application provides a method for detecting margins of a data signal. The receive end of the DQ may automatically detect the timing margin and voltage margin of the DQ by adjusting the voltage of the reference power source and the timing of the DQS. In the detection process, no other external detection device needs to be connected, and no parameter needs to be manually adjusted. Therefore, detection efficiency is effectively improved, and detection costs are reduced. In addition, because the timing margin and the voltage margin are determined by the storage controller based on whether a bit error exists in data actually obtained by decoding, reliability of the detection result can be ensured.

In addition, in the method provided by an embodiment of the application, whether margins of a currently tested sample of the storage device meet a requirement may be directly determined based on a detection result, and dependence on a sample quantity and sample types is weakened. The method resolves a problem that samples and data are insufficient because a current test procedure cannot cover samples having different process corners, effectively improves margin detection accuracy and efficiency, ensures that the storage device can work reliably under different PVT conditions, and can support a higher data transmission rate.

Figure 6:
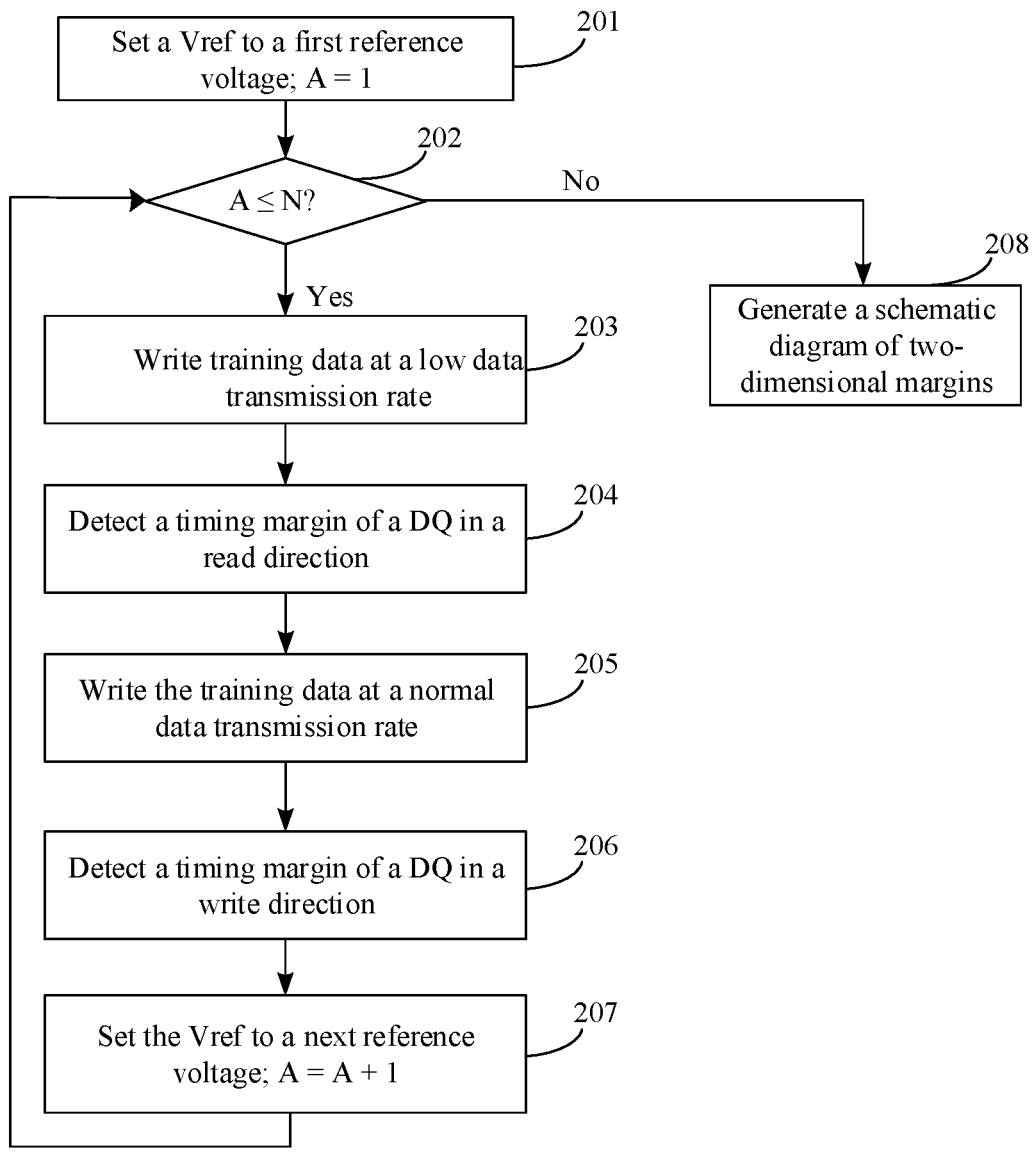
FIG. 6 is a flowchart of another method for detecting margins of a DQ according to an embodiment of this application.

In an embodiment, as shown in FIG. 6, a method for detecting margins of a DQ may include the following procedure.

Operation 201: A storage controller sets a voltage of a reference power source VREF to a first reference voltage in a reference voltage set, and marks A=1. A may be used to indicate a quantity of reference voltages currently already swept by the voltage of the reference power source VREF, in the reference voltage set.

Operation 202: The storage controller detects whether A is less than or equal to N. If A is less than or equal to N, operation 203 is performed; or if A is not less than N, operation 208 is performed.

N is a total quantity of reference voltages included in the reference voltage set, and N is an integer greater than 1. When A≤N, the storage controller may determine that the voltage of the reference power source VREF has not traversed the reference voltage set, and therefore may perform operation 203; or when A>N, the storage controller may determine that the voltage of the reference power source VREF has traversed the reference voltage set, and therefore may perform operation 207.

Operation 203: The storage controller writes training data at a low data transmission rate.

In an embodiment of the application, the storage controller may write the training data to a storage medium at the relatively low data transmission rate, to ensure correct writing of the training data. The training data may be data prestored in the storage controller, for example, may be data customized by a developer.

Operation 204: The storage controller detects a timing margin of a DQ in a read direction.

The storage controller may transmit, to the storage medium, an instruction for reading the training data, and receive, by using an NFI bus, the DQ carrying the training data, and a DQS that are transmitted by the storage medium. The storage controller may adjust a moment of an edge of the DQS within a range of a plurality of reference moments included in a reference moment set (that is, adjust a timing of the DQS), and detect whether a bit error exists in data obtained by decoding the DQ based on the current reference voltage and the DQS after the timing is adjusted, to obtain a timing margin of the DQ in the read direction at the current reference voltage.

After the foregoing operation 204, the storage controller or the developer may first calibrate a related parameter of a storage device based on a detection result of the timing margin of the DQ in the read direction, to ensure that the timing margin of the DQ in the read direction can ensure correct decoding of the data, that is, ensure that the storage controller can correctly read the data.

Operation 205: The storage controller writes the training data at a normal data transmission rate.

The storage controller may write the training data to the storage medium again at the normal data transmission rate. The normal data transmission rate is a data transmission rate at which the storage controller writes the data to the storage medium when the storage controller works normally.

Operation 206: The storage controller detects a timing margin of a DQ in a write direction.

The storage controller may read the training data from the storage medium again. Because after the foregoing operation 204, a parameter-based adjustment operation can ensure reliability of the training data read by the storage controller, the storage controller can detect, by using the read training data, whether a bit error exists in the written training data, that is, implement detection of the timing margin of the DQ in the write direction.

Operation 207: The storage controller sets the voltage of the reference power source VREF to a next reference voltage in the reference voltage set, and updates A to A+1. Then operation 202 is performed.

The storage controller may perform the foregoing operation 202 to operation 207 cyclically until A>N.

Operation 208: The storage controller generates a schematic diagram of two-dimensional margins.

If the storage controller detects that A is greater than N in the foregoing operation 202, it may be determined that the reference voltage set has been traversed. Therefore, the storage controller may generate a schematic diagram of two-dimensional margins of the DQ in the read direction and a schematic diagram of two-dimensional margins of the DQ in the write direction separately based on the timing margins of the DQ in the read direction and the timing margins of the DQ in the write direction that are obtained through detection at different reference voltages.

A horizontal axis of the schematic diagram of the two-dimensional margins may be used to indicate the moment of the edge of the DQS, a vertical axis may be used to indicate the voltage of the reference power source VREF, and different graphical symbols may be used at each coordinate point in the schematic diagram to indicate whether a bit error exists in data obtained by decoding based on parameters at the coordinate point.

Figure 7:
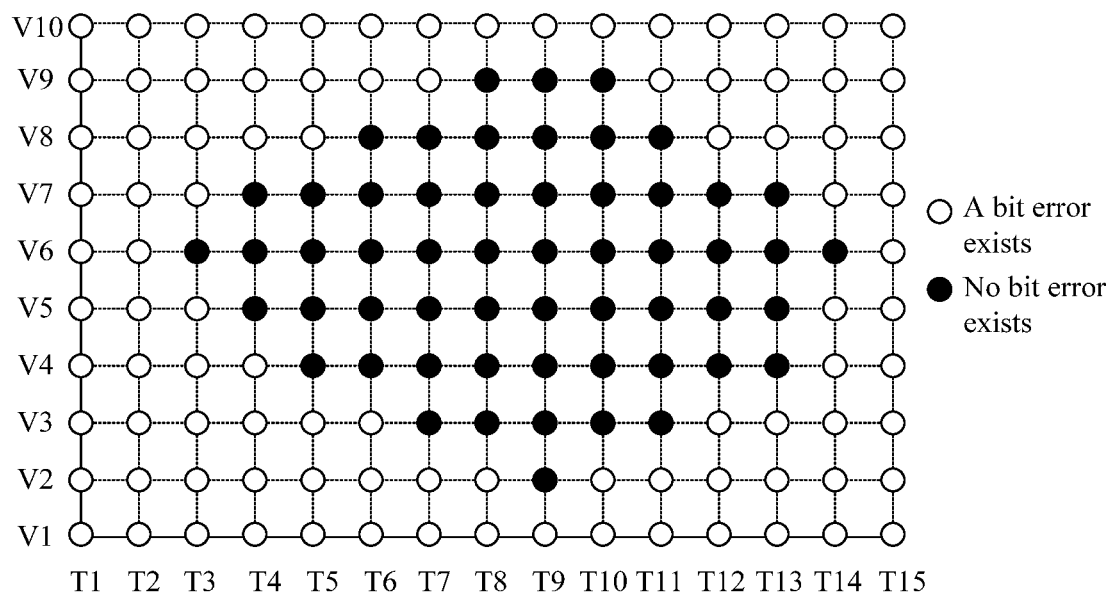
FIG. 7 is a schematic diagram of two-dimensional margins of a DQ according to an embodiment of this application.

For example, assuming that the margins of the DQ in the read direction are detected, the reference voltage set includes a reference voltage V1 to a reference voltage V10, 10 reference voltages in total, and the reference moment set includes T1 to T15, 15 reference moments in total, a schematic diagram of two-dimensional margins of the DQ in the read direction that is finally generated by the storage controller may be shown in FIG. 7. In the schematic diagram, a white circle indicates that a bit error exists, and a black circle indicates that no bit error exists. Referring to FIG. 7, if the voltage of the reference power source VREF is a reference voltage V3, when the moment of the edge of the DQS is a reference moment T7 to a reference moment T11, no bit error exists in data obtained by decoding the DQ, that is, a timing margin of the DQ at the reference voltage V3 is T7 to T11. As can be seen from FIG. 7, when the voltage of the reference power source VREF is a reference voltage V6, a timing margin of the DQ is the largest. If the moment of the edge of the DQS is a reference moment T6, when the voltage of the reference power source VREF is a reference voltage V4 to a reference voltage V8, no bit error exists in data obtained by decoding the DQ, that is, a voltage margin of the DQ at the reference moment T6 is V4 to V8. As can be seen from FIG. 7, when the moment of the edge of the DQS is a reference moment T9, a voltage margin of the DQ is the largest. The schematic diagram of the two-dimensional margins generated by the storage controller can visually reflect timing margins of the DQ at different reference voltages, so that an operator can adjust a related parameter of the storage device conveniently based on the schematic diagram.

As can be learned from the foregoing descriptions, in an embodiment, the storage controller may adjust the voltage of the reference power source VREF to each reference voltage in the reference voltage set in sequence, so that the voltage of the reference power source VREF traverses the reference voltage set. In addition, after each adjustment, both the timing margin of the DQ in the read direction and the timing margin of the DQ in the write direction at the reference voltage may be detected. Finally, a schematic diagram of two-dimensional margins may be generated based on the timing margin obtained through detection at each reference voltage.

In the method procedure shown in FIG. 6, operation 205 and operation 206 may be deleted, that is, the storage controller may detect only the timing margin of the DQ in the read direction. Correspondingly, operation 203 may also be performed before operation 201. In an embodiment, the storage controller may first write the training data, and then adjust the voltage of the reference power source and the timing of the DQS, to detect the timing margin of the DQ in the read direction. Likewise, operation 203 and operation 204 may also be deleted, that is, the storage controller may detect only the timing margin of the DQ in the write direction. Correspondingly, operation 205 may also be performed before operation 201. In an embodiment, the storage controller may first write the training data, and then adjust the voltage of the reference voltage end and the timing of the DQS, to detect the timing margin of the DQ in the write direction.

Figure 8:
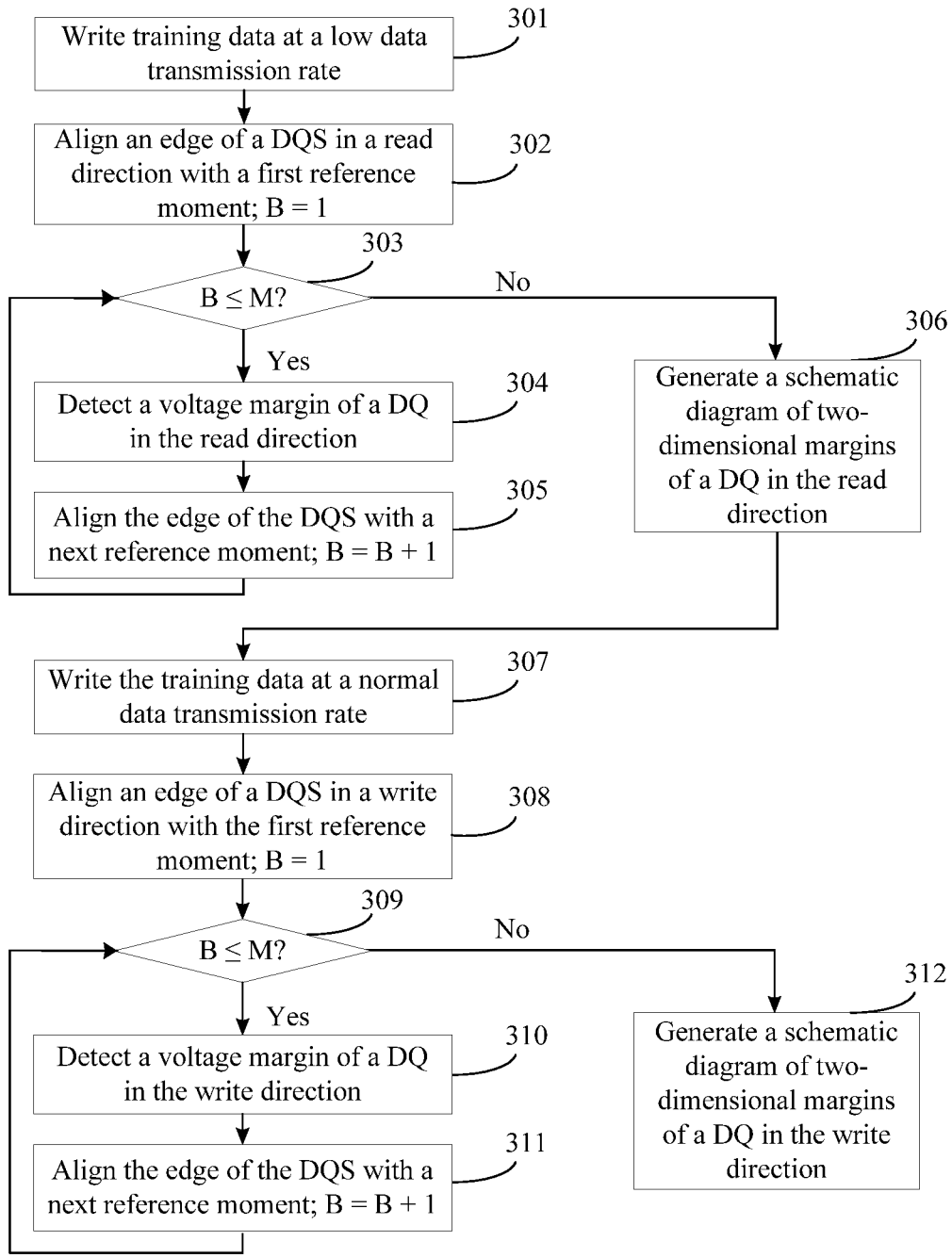
FIG. 8 is a flowchart of still another method for detecting margins of a DQ according to an embodiment of this application.

In an embodiment, as shown in FIG. 8, a method for detecting margins of a DQ may include the following procedure.

Operation 301: A storage controller writes training data at a low data transmission rate.

In an embodiment of the application, the storage controller may write the training data to a storage medium at the relatively low data transmission rate.

Operation 302: The storage controller adjusts an edge of a DQS in a read direction to a first reference moment in a reference moment set, and marks B=1.

B may be used to indicate a quantity of reference moments currently already swept by the edge of the DQS, in the reference moment set. In an embodiment, the storage controller may transmit, to the storage medium, an instruction for reading the training data written in operation 301, and receive, by using an NFI bus, a DQ carrying the training data, and the DQS that are transmitted by the storage medium. Then the storage controller may adjust a timing of the DQS, so that a moment of the edge of the DQS is the first reference moment in the reference moment set, that is, the edge of the DQS is aligned with the first reference moment.

Operation 303: The storage controller detects whether B is less than or equal to M. If B is less than or equal to M, operation 304 is performed; or if B is not less than M, operation 306 is performed.

M is a total quantity of reference moments included in the reference moment set, and M is an integer greater than 1. When B≤M, the storage controller may determine that the moment of the edge of the DQS has not traversed the reference moment set, and therefore may perform operation 304; or if B>M, the storage controller may determine that the moment of the edge of the DQS has traversed the reference moment set, and therefore may perform operation 306.

Operation 304: The storage controller detects a voltage margin of the DQ in the read direction.

Within a range of a plurality of reference voltages included in a reference voltage set, the storage controller may adjust a voltage of a reference power source VREF, and detect whether a bit error exists in data obtained by decoding the DQ based on the current reference moment and the voltage after the adjustment, to obtain a start boundary voltage and an end boundary voltage of the DQ in the read direction at the current reference moment. The start boundary voltage is a lowest reference voltage that enables the data obtained by decoding to be free of bit errors, in the plurality of reference voltages, and the end boundary voltage is a highest reference voltage that enables the data obtained by decoding to be free of bit errors, in the plurality of reference voltages.

Operation 305: The storage controller adjusts the edge of the DQS to a next reference moment in the reference moment set, and updates B to B+1. Then operation 303 is performed. The storage controller may perform the foregoing operation 303 to operation 305 cyclically until B>M.

Operation 306: The storage controller generates a schematic diagram of two-dimensional margins of the DQ in the read direction.

If the storage controller detects that B is greater than M in the foregoing operation 303, it may be determined that the reference moment set has been traversed. Therefore, the storage controller may generate a schematic diagram of two-dimensional margins of the DQ in the read direction based on the voltage margins of the DQ in the read direction that are obtained through detection at different reference moments.

In an embodiment of the application, after the voltage margin of the DQ in the read direction is detected, the storage controller or a developer may first calibrate a related parameter of a storage device based on a detection result of the timing margin of the DQ in the read direction, to ensure that the timing margin of the DQ in the read direction can ensure correct decoding of data, that is, ensure that the storage controller can correctly read data.

Operation 307: The storage controller writes the training data at a normal data transmission rate.

The storage controller may write the training data to the storage medium again at the normal data transmission rate, and transmit, to the storage medium, an instruction for reading the training data, to instruct the storage medium to transmit a DQ carrying the training data, and a DQS in the read direction. Because after the foregoing operation 306, a parameter-based adjustment operation can ensure reliability of the training data read by the storage controller, the storage controller can detect, by using the read training data, whether a bit error exists in the written training data, that is, implement detection of a voltage margin of a DQ in a write direction.

Operation 308: The storage controller adjusts an edge of a DQS in the write direction to the first reference moment in the reference moment set, and marks B=1.

The storage controller may use the DQS transmitted by the storage medium in the read direction as the DQS in the write direction, and perform a timing adjustment.

Operation 309: The storage controller detects whether B is less than or equal to M. If B is less than or equal to M, operation 310 is performed; or if B is not less than M, operation 312 is performed.

Operation 310: The storage controller detects the voltage margin of the DQ in the write direction.

Operation 311: The storage controller adjusts the edge of the DQS to a next reference moment in the reference moment set, and updates B to B+1. Then operation 309 is performed.

Operation 312: The storage controller generates a schematic diagram of two-dimensional margins of the DQ in the write direction.

For an implementation process of the foregoing operation 308 to operation 312, refer to related descriptions in operation 302 to operation 306. Details are not described again herein. As can be learned from the foregoing descriptions, in an embodiment, the storage controller may adjust the moment of the edge of the DQS to each reference moment in the reference moment set in sequence, so that the moment of the edge of the DQS traverses the reference moment set. In addition, after each adjustment, both the voltage margin of the DQ in the read direction and the voltage margin of the DQ in the write direction at the reference moment may be detected. Finally, a schematic diagram of two-dimensional margins may be generated based on the voltage margin obtained through detection at each reference moment.

Figure 9A:
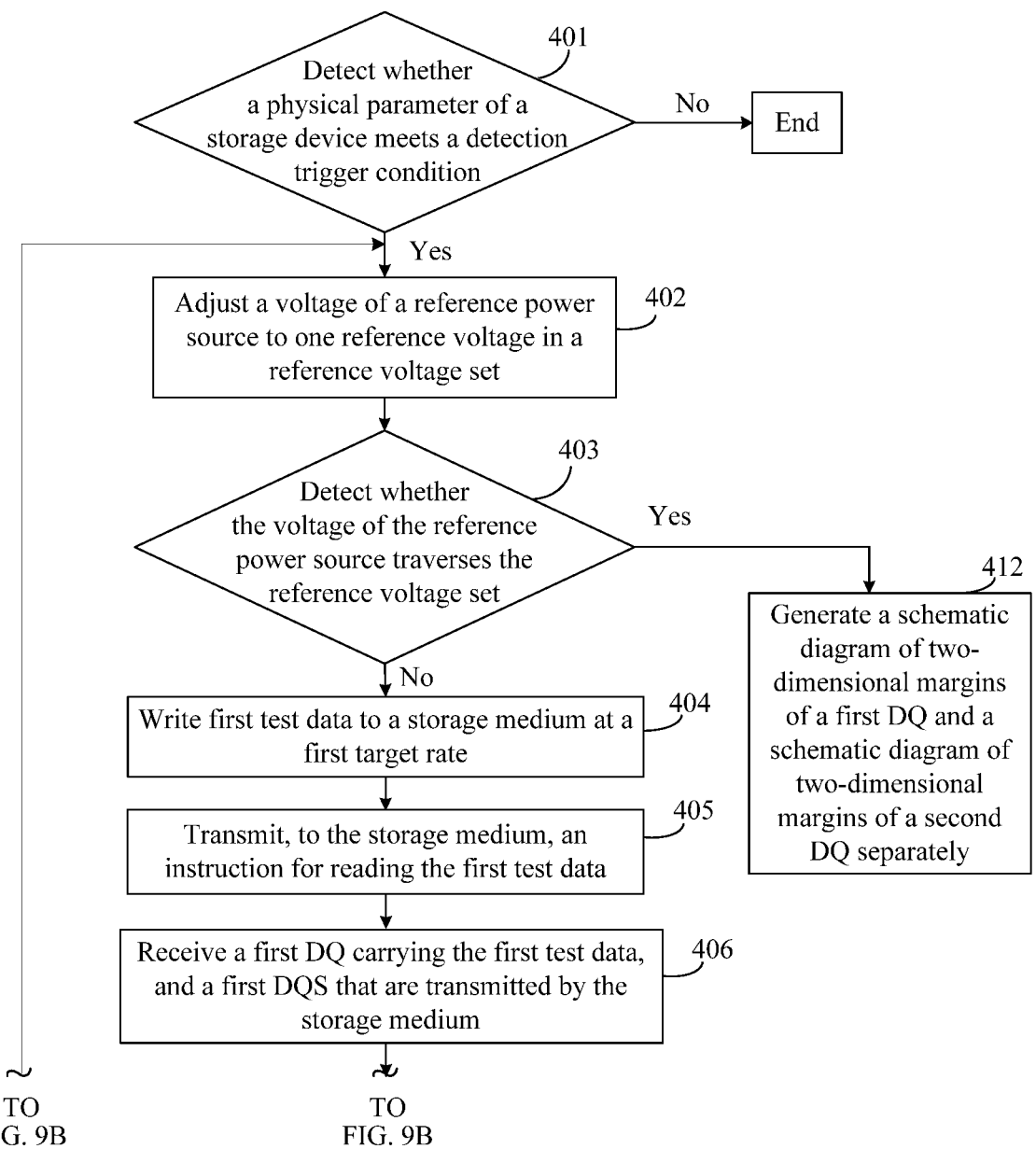
FIG. 9A and FIG. 9B are a flowchart of yet another method for detecting margins of a DQ according to an embodiment of this application.
Figure 9B:
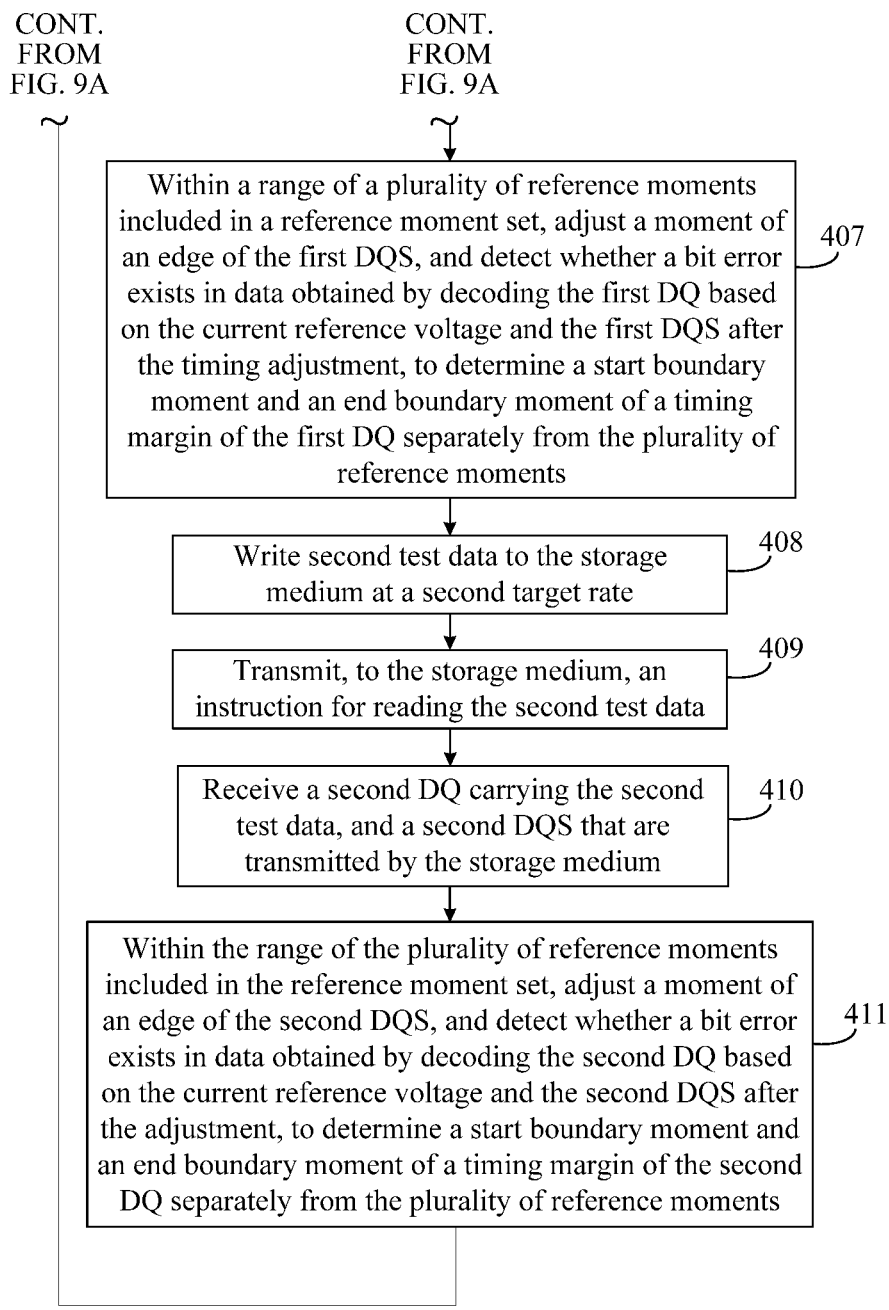

A method for detecting margins of a DQ is hereinafter described by using an example in which the method is applied to a storage controller, a timing margin at each reference voltage in a reference voltage set is first determined, and then two-dimensional margins of the DQ are determined. As shown in FIG. 9A and FIG. 9B, the method may include the following operations.

Operation 401: Detect whether a physical parameter of a storage device meets a detection trigger condition.

In an embodiment of the application, after power-up, a storage controller may obtain the physical parameter of the storage device in real time, and detect whether the physical parameter meets a detection trigger condition. For example, the storage controller may obtain the physical parameter of the storage device in a plurality of different scenarios such as a test phase, a service running process, or a service idle phase, and detect whether the physical parameter meets the detection trigger condition. If the physical parameter meets the detection trigger condition, operation 402 may be performed, that is, margin detection continues to be performed. If the physical parameter does not meet the detection trigger condition, service running may be continued, but there is no need to continue to perform the following operation.

In an embodiment, the physical parameter may include one or more of a physical parameter of the storage controller and a physical parameter of a storage medium. For example, the physical parameter may include a PVT parameter, for example, may include one or more of temperature, humidity, working voltage, data transmission rate, and data transmission amount. Correspondingly, the detection trigger condition may include one or more of the following conditions: A temperature is beyond a temperature threshold range; humidity is beyond a humidity threshold range; a working voltage is beyond a voltage threshold range; a data transmission rate is greater than a rate threshold; and a data transmission amount is greater than a service traffic threshold. The temperature threshold, the humidity threshold, the voltage threshold, the rate threshold, and the service traffic threshold may all be preconfigured in the storage controller, and may be configured by a developer based on an application requirement of the storage device.

In an embodiment of the application, alternatively, the procedure for detecting margins of a DQ may be manually triggered by test personnel. For example, a test device in which debugging software is installed may be connected to the storage controller by using a serial port. The test personnel may transmit a detection instruction to the storage controller by using the debugging software, and then the storage controller can perform the following operation 402 in response to the detection instruction. Alternatively, after power-up and startup each time, the storage controller may perform the procedure for detecting margins of a DQ, that is, the storage controller may automatically trigger a detection instruction after power-up each time.

Operation 402: Adjust a voltage of a reference power source to one reference voltage in a reference voltage set.

The reference voltage set may include a plurality of different reference voltages, and the plurality of different reference voltages may be to-be-detected voltages preconfigured by the developer. In an embodiment of the application, referring to FIG. 3, the storage controller may adjust a value of a register 012 by using a processing circuit, to adjust an output voltage of a bleeder circuit 0111. In this way, the voltage of the reference power source VREF is adjusted.

In a process of designing and developing the storage controller 01, an adjustable quantity of values of the register 012 may be determined based on a quantity of bits of the register 012. Then a quantity N of reference voltages included in the reference voltage set may be determined based on the adjustable quantity. The quantity N of the reference voltages may be greater than 1, and is less than or equal to the adjustable quantity. For example, N may be equal to the adjustable quantity. Then voltage values of the N reference voltages may be determined based on a voltage change range of the reference power source VREF, that is, the voltage change range of the reference power source VREF may be divided into N different positions. Finally, the processing circuit, the register 012, and the bleeder circuit 0111 may be configured, so that the processing circuit stores N values of the register 012 that correspond to the N reference voltages on a one-to-one basis. When the processing circuit adjusts the value of the register 012 to one of the N values, a voltage output by the bleeder circuit 0111 to the reference power source VREF may be a reference voltage corresponding to the value.

For example, assuming that the register 012 is an n-bit register, where n is an integer greater than 1, an adjustable quantity of values of the register may be 1 to 2n, and the quantity N of the reference voltages included in the reference voltage set may also be 2n.

Operation 403: Detect whether the voltage of the reference power source traverses the reference voltage set.

If the reference voltage set is not traversed, operation 404 is performed; or if the reference voltage set is traversed, operation 412 may be performed. In an embodiment, to improve detection efficiency, the storage controller may adjust the voltage of the reference power source in sequence from a first reference voltage in the reference voltage set, until a last reference voltage. For example, the storage controller may adjust the voltage of the reference power source in sequence in descending or ascending order of reference voltages.

In addition, for ease of collecting statistics, the storage controller may record a marker bit A, where an initial value of the marker bit A may be 0. Every time the storage controller adjusts the voltage of the reference power source, the marker bit A may be updated to A+1. Correspondingly, when detecting whether the voltage of the reference power source traverses the reference voltage set, the storage controller may directly detect whether the marker bit A is less than or equal to N. If A is less than or equal to N, it may be determined that traversal is not completed; or if A is greater than N, it may be determined that traversal is completed.

Operation 404: Write first test data to the storage medium at a first target rate.

In an embodiment of the application, the storage controller may first detect a timing margin of a DQ in a read direction. Because the DQ in the read direction is generated by the storage medium based on the data written by the storage controller, to ensure reliability of detection, it needs to be ensured that the data written by the storage controller to the storage medium is accurate. Therefore, in an embodiment of the application, the storage controller may write the first test data to the storage medium at a relatively low data transmission rate. The first test data may be data prestored in the storage controller, or may be data customized by the developer.

In an embodiment, the storage controller may first determine a working mode of an interface bus between the storage controller and the storage medium, and then determine, based on a prestored correspondence between a working mode and a bus rate range, a bus rate range corresponding to the working mode of the interface bus. Then a lower limit rate within the determined bus rate range may be used as the first target rate for writing the first test data. For example, assuming that the interface bus is an NFI bus, and as shown in Table 1, working modes of the NFI bus may include a single data rate (SDR) mode, a non-volatile dual data rate (NV-DDR) mode, an NV-DDR2 (second-generation NV-DDR) mode, and an NV-DDR3 (third-generation NV-DDR) mode. A bus rate range corresponding to the SDR mode is 10 to 50 million bits per second (Mbps), and a bus rate range corresponding to the NV-DDR mode is 40 to 200 Mbps.

TABLE 1

| Working mode | Bus rate range (Mbps) |
| --- | --- |
| SDR | 10 to 50 |
| NV-DDR | 40 to 200 |
| NV-DDR2 | 66 to 800 |
| NV-DDR3 | 66 to 1200 |

If the storage controller determines that the current working mode of the NFI bus is the NV-DDR mode, the storage controller may determine that the first target rate is 40 Mbps, and may write the first test data to the storage medium at the data transmission rate of 40 Mbps.

It is assumed that the NFI bus includes eight lines, and the eight lines can transmit data of eight bits (that is, one byte) in parallel each time. As shown in Table 2, the first test data may include four bytes: a BYTE0 to a BYTE3, and the four bytes may be represented by 0x5AA55AA5 in hexadecimal (Hex) notation. The first byte BYTE0 and the third byte BYTE2 are both 5A, and the second byte BYTE1 and the fourth byte BYTE3 are both A5. When the first byte BYTE0 is transmitted in parallel, binary (Bin) data carried in eight DQs, that is, a DQ0 to a DQ7, transmitted by the eight lines in parallel may be 0, 1, 0, 1, 1, 0, 1, and 0 respectively. When the second byte BYTE1 is transmitted in parallel, binary data carried in eight DQs, that is, the DQ0 to the DQ7, transmitted by the eight lines in parallel may be 1, 0, 1, 0, 0, 1, 0, and 1 respectively.

TABLE 2

| Data | BYTE0 | | BYTE1 | | BYTE2 | | BYTE3 | |
|------|-----|-----|-----|-----|-----|-----|-----|-----|
|      | Hex | Bin | Hex | Bin | Hex | Bin | Hex | Bin |
| DQ0  | 5   | 0   | A   | 1   | 5   | 0   | A   | 1   |
| DQ1  |     | 1   |     | 0   |     | 1   |     | 0   |
| DQ2  |     | 0   |     | 1   |     | 0   |     | 1   |
| DQ3  |     | 1   |     | 0   |     | 1   |     | 0   |
| DQ4  | A   | 1   | 5   | 0   | A   | 1   | 5   | 0   |
| DQ5  |     | 0   |     | 1   |     | 0   |     | 1   |
| DQ6  |     | 1   |     | 0   |     | 1   |     | 0   |
| DQ7  |     | 0   |     | 1   |     | 0   |     | 1   |

Figure 10:
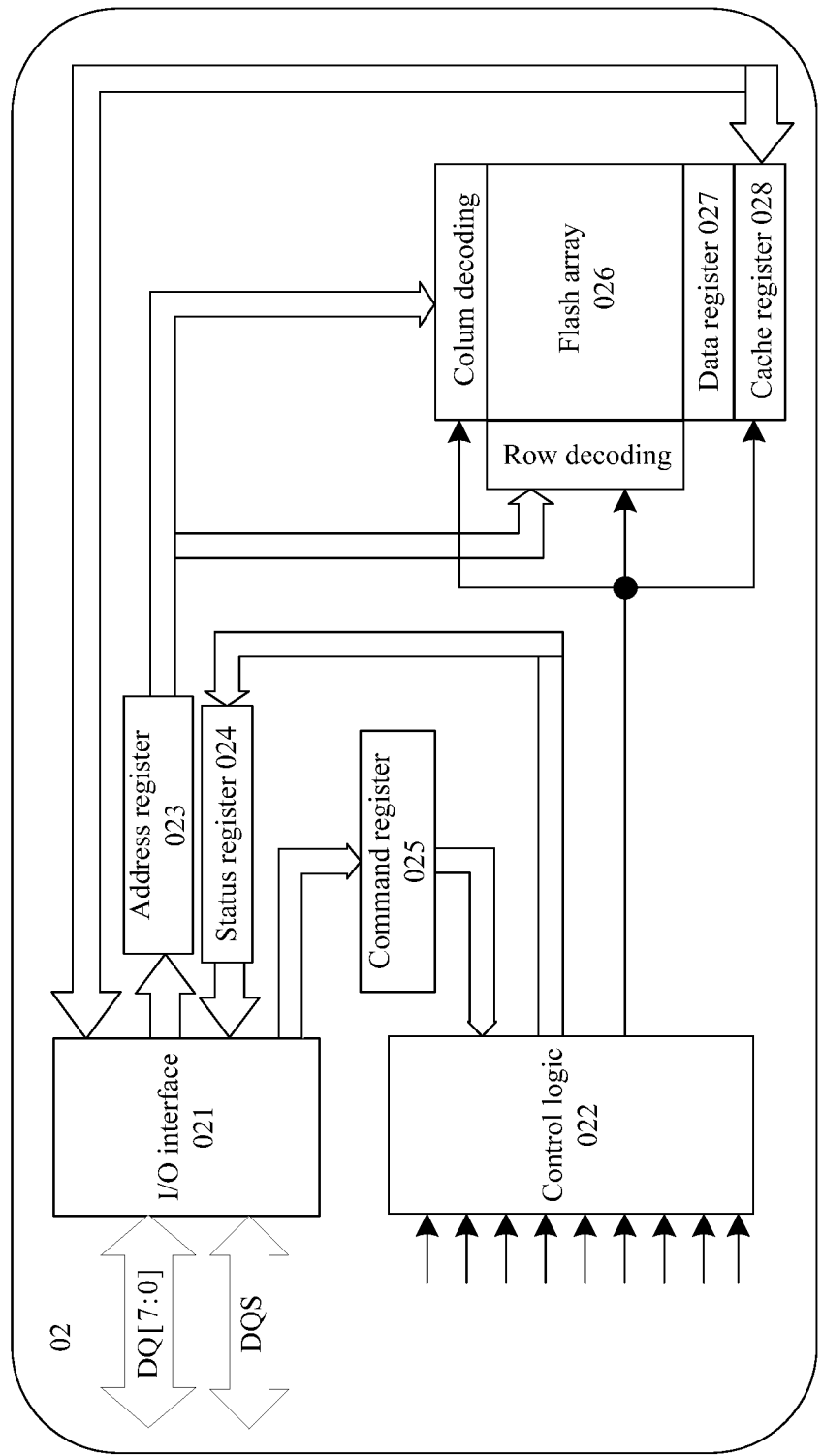
FIG. 10 is a schematic structural diagram of a storage medium according to an embodiment of this application.

FIG. 10 is a schematic structural diagram of a storage medium according to an embodiment of this application. As shown in FIG. 10, the storage medium may further include a control logic circuit 022, an address register 023, a status register 024, a command register 025, a flash array 026, a data register 027, and a cache register 028. The storage controller 01 may write the first test data to the cache register 028. In addition, a length of the written first test data may not be greater than a length of a flash page.

Operation 405: Transmit, to the storage medium, an instruction for reading the first test data.

The read instruction may be used to instruct the storage medium to transmit the first test data to the storage controller.

Operation 406: Receive a first DQ carrying the first test data, and a first DQS that are transmitted by the storage medium.

In an embodiment of the application, the storage medium may generate, in response to the read instruction, the first DQ carrying the first test data, and the first DQS. The first DQ may include a plurality of DQs, for example, may include eight DQs, where edges of the plurality of DQs are aligned, and an edge of the first DQS is also aligned with the edges of the plurality of the DQs.

Operation 407: Within a range of a plurality of reference moments included in a reference moment set, adjust a moment of the edge of the first DQS, and detect whether a bit error exists in data obtained by decoding the first DQ based on the current reference voltage and the first DQS after the timing adjustment, to determine a start boundary moment and an end boundary moment of a timing margin of the first DQ separately from the plurality of reference moments.

The start boundary moment is an earliest reference moment that enables the data obtained by decoding to be free of bit errors, in the plurality of reference moments, and the end boundary moment is a latest reference moment that enables the data obtained by decoding to be free of bit errors, in the plurality of reference moments.

Figure 11:
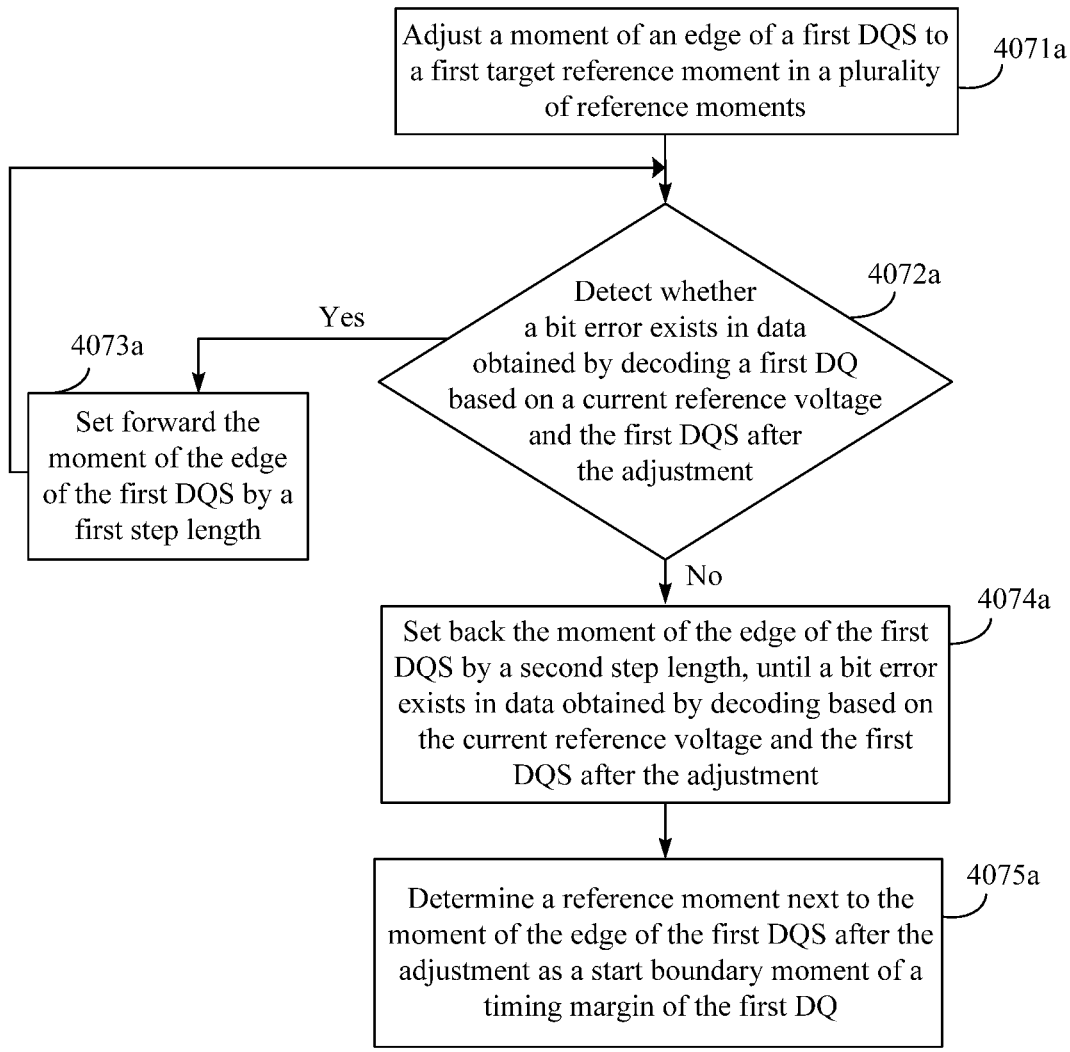
FIG. 11 is a flowchart of a method for determining a start boundary moment of a timing margin of a first DQ according to an embodiment of this application.

FIG. 11 is a flowchart of a method for determining a start boundary moment of a timing margin of a first DQ according to an embodiment of this application. Referring to FIG. 11, the method may include the following operations.

Operation 4071a: Adjust the moment of the edge of the first DQS to a first target reference moment in the plurality of reference moments.

In an embodiment, the plurality of reference moments included in the reference moment set may be arranged in ascending order, the first target reference moment may be an $X^{th}$ reference moment in the plurality of reference moments, X is a positive integer less than M/2, and M is a total quantity of reference moments included in the reference moment set. In an embodiment, the first target reference moment may be a relatively early reference moment in the plurality of reference moments, for example, may be the earliest reference moment, that is, X may be equal to 1. The first target reference moment may be used as an initial start boundary moment. In an embodiment of the application, the plurality of reference moments may be obtained by dividing a cycle of the DQS. If a time difference between two adjacent reference moments is fixed, that is, a time scale unit is fixed, when the data transmission rate of the interface bus is higher, the cycle of the DQS is shorter, and fewer reference moments are included in the reference moment set.

For example, assuming that the data transmission rate of the NFI bus is 400 Mbps, the cycle of the DQS is 2.5 nanoseconds (ns). The cycle of 2.5 ns may be divided into 320 reference moments, and the first target reference moment may be a $24^{th}$ reference moment, that is, a reference moment 24. Certainly, the first target reference moment may also be a first reference moment, that is, a reference moment 1.

Operation 4072a: Detect whether a bit error exists in data obtained by decoding the first DQ based on the current reference voltage and the first DQS after the adjustment.

In an embodiment of the application, based on the current reference voltage provided by the reference power source VREF and the first DQS after the timing adjustment, the storage controller may decode the plurality of DQs included in the first DQ, and detect whether a bit error exists in data obtained by decoding the plurality of DQs included in the first DQ. If a bit error exists in data obtained by decoding any DQ in the first DQ, the storage controller may perform operation 4073a. If no bit error exists in data obtained by decoding each DQ in the first DQ, the storage controller may perform operation 4074a.

For example, it is assumed that the first test data written by the storage controller to the storage medium is "01011010", and data obtained by the storage controller by decoding eight DQs included in the first DQ, that is, the DQ0 to the DQ7, is "11011010". In this case, because a bit error exists in the data obtained by decoding, the storage controller may perform operation 4073a.

Operation 4073a: Set forward the moment of the edge of the first DQS by a first operation length. Then operation 4072a is performed.

In an embodiment of the application, if a bit error exists in the data obtained by decoding the first DQ based on the current reference voltage and the first DQS after the adjustment, the storage controller may determine that the moment of the edge of the first DQS is beyond the range of the timing margin of the first DQ, and therefore may set forward the moment of the edge of the first DQS by using the first step length as a unit, that is, may adjust a timing of the first DQS rightward. Then the storage controller may continue to perform operation 4072a. In an embodiment, the storage controller may adjust the timing of the first DQS rightward gradually by using the first step length as a unit, until no bit error exists in data obtained by decoding the first DQ based on the current reference voltage and the first DQS after the adjustment.

Operation 4074a: Set back the moment of the edge of the first DQS by a second step length, until a bit error exists in data obtained by decoding based on the current reference voltage and the first DQS after the adjustment.

If no bit error exists in the data obtained by decoding the first DQ based on the current reference voltage and the first DQS after the adjustment, the storage controller may determine that the moment of the edge of the first DQS is within the range of the timing margin of the first DQ, and therefore may set back the moment of the edge of the first DQS gradually by using the second step length as a unit, that is, may adjust the timing of the first DQS leftward. The second step length may be equal to a time difference between two adjacent reference moments. The first step length may be greater than the second step length and may be an integer multiple of the second step length. In an embodiment, the second step length may be equal to a scale unit in division of the reference moments, and the first step length may be several times the scale unit. For example, the first step length may be 8 times the second step length.

Operation 4075a: Determine a reference moment next to the moment of the edge of the first DQS after the adjustment as the start boundary moment of the timing margin of the first DQ.

When detecting that a bit error exists in the data obtained by decoding based on the current reference voltage and the first DQS after the adjustment, the storage controller may determine that the reference moment (that is, the moment of the edge of the first DQS before the adjustment) next to the current moment of the edge of the first DQS is the earliest reference moment that enables the data obtained by decoding to be free of bit errors, in the plurality of reference moments, that is, the next reference moment is the start boundary moment of the timing margin of the first DQ.

Figure 12:
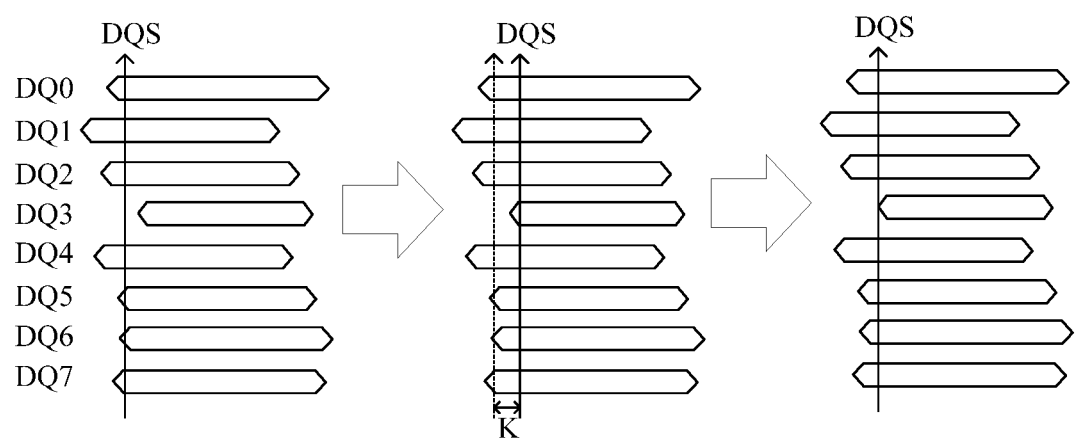
FIG. 12 is a schematic diagram for adjusting a timing of a DQS according to an embodiment of this application.

For example, referring to FIG. 12, the storage controller may first coarsely adjust the moment of the edge of the first DQS rightward by using the first step length K as a unit, and then finely adjust the moment of the edge of the first DQS leftward by using the second step length 1 as a unit, until the storage controller determines the earliest reference moment that enables all data obtained by decoding the DQ0 to the DQ7 to be free of bit errors.

Figure 13:
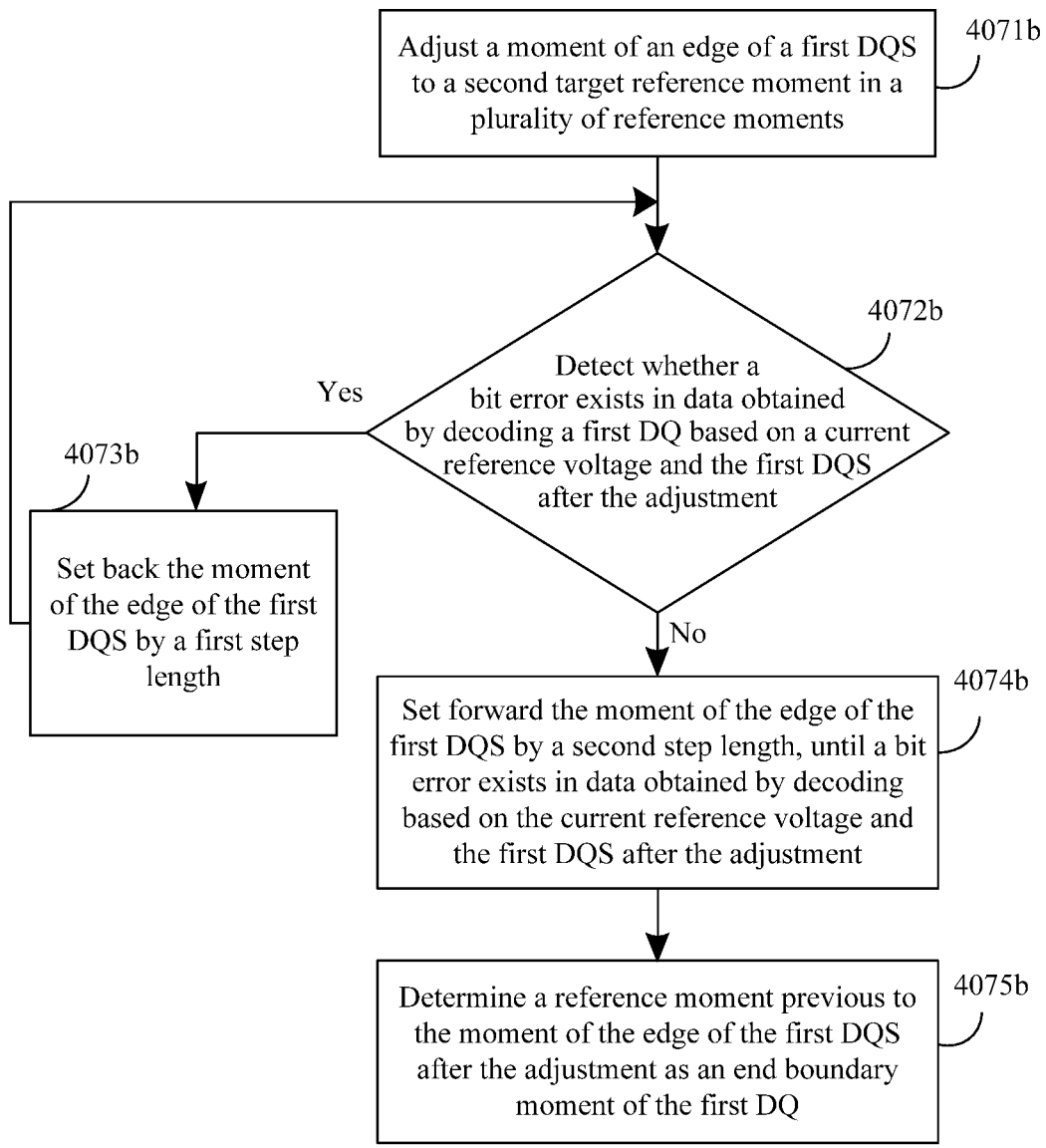
FIG. 13 is a flowchart of a method for determining an end boundary moment of a timing margin of a first DQ according to an embodiment of this application.

FIG. 13 is a flowchart of a method for determining an end boundary moment of a timing margin of a first DQ according to an embodiment of this application. Referring to FIG. 13, the method may include the following operations.

Operation 4071b: Adjust the moment of the edge of the first DQS to a second target reference moment in the plurality of reference moments.

In an embodiment, the second target reference moment may be a $Y^{th}$ reference moment in the plurality of reference moments, and Y is a positive integer greater than M/2. In an embodiment, the second target reference moment may be a relatively late reference moment in the plurality of reference moments, for example, may be the latest reference moment. The second target reference moment is an initial end boundary moment.

For example, assuming that the data transmission rate of the NFI bus is 400 Mbps, a cycle of the DQS is 2.5 ns. The cycle of 2.5 ns may be divided into 320 reference moments. The first target reference moment may be a $24^{th}$ reference moment, and the second target reference moment may be a $320^{th}$ reference moment, that is, a reference moment 320.

Operation 4072b: Detect whether a bit error exists in data obtained by decoding the first DQ based on the current reference voltage and the first DQS after the adjustment.

If a bit error exists, the storage controller may perform operation 4073b. If no bit error exists, the storage controller may perform operation 4074b.

Operation 4073b: Set back the moment of the edge of the first DQS by a first step length. Then operation 4072b is performed.

If a bit error exists in the data obtained by decoding the first DQ based on the current reference voltage and the first DQS after the adjustment, the storage controller may determine that the moment of the edge of the first DQS is beyond the range of the timing margin of the first DQ, and therefore may set back the moment of the edge of the first DQS gradually by using the first step length as a unit, that is, may adjust a timing of the first DQS leftward. Then the storage controller may continue to perform operation 4072b. In an embodiment, the storage controller may adjust the timing of the first DQS leftward gradually by using the first step length as a unit, until no bit error exists in data obtained by decoding based on the current reference voltage and the first DQS after the adjustment.

Operation 4074b: Set forward the moment of the edge of the first DQS by a second step length, until a bit error exists in data obtained by decoding based on the current reference voltage and the first DQS after the adjustment.

If no bit error exists in the data obtained by decoding the first DQ based on the current reference voltage and the first DQS after the adjustment, the storage controller may determine that the moment of the edge of the first DQS is within the range of the timing margin of the first DQ, and therefore may set forward the moment of the edge of the first DQS gradually by using the second step length as a unit, that is, may adjust the timing of the first DQS rightward.

Operation 4075b: Determine a reference moment previous to the moment of the edge of the first DQS after the adjustment as the end boundary moment of the timing margin of the first DQ.

Figure 14:
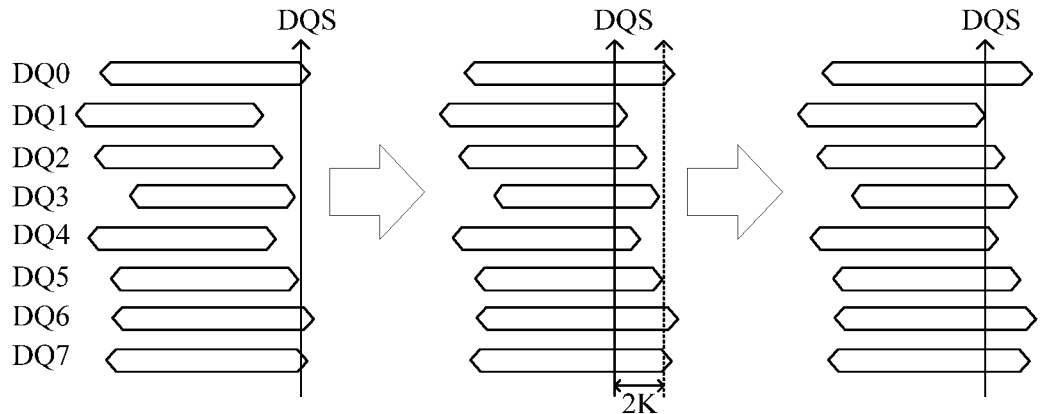
FIG. 14 is another schematic diagram for adjusting a timing of a DQS according to an embodiment of this application.

The second step length may be equal to a time difference between two adjacent reference moments. The first step length may be greater than the second step length and may be an integer multiple of the second step length. For example, referring to FIG. 14, the storage controller may first coarsely adjust the moment of the edge of the first DQS leftward by using the first step length K as a unit, so that the moment of the edge of the first DQS is within the range of the timing margin of the first DQ, and then finely adjust the moment of the edge of the first DQS rightward by using the second step length 1 as a unit, until the storage controller determines the latest reference moment that enables all data obtained by decoding the DQ0 to the DQ7 to be free of bit errors.

As can be learned from the foregoing procedure for determining the start boundary moment and the end boundary moment, if a bit error exists in the data obtained by decoding the first DQ based on the current reference voltage and the first DQS after the adjustment, the storage controller may coarsely adjust the timing of the first DQS by using the first step length, until the moment of the edge of the first DQS is within the range of the timing margin of the first DQ. Then the storage controller may finely adjust the timing of the first DQS by using the second step length, and therefore accurately determine the start boundary moment and the end boundary moment of the timing margin of the first DQ. The foregoing adjustment manner can effectively improve efficiency of determining the boundary moment of the timing margin.

Figure 15:
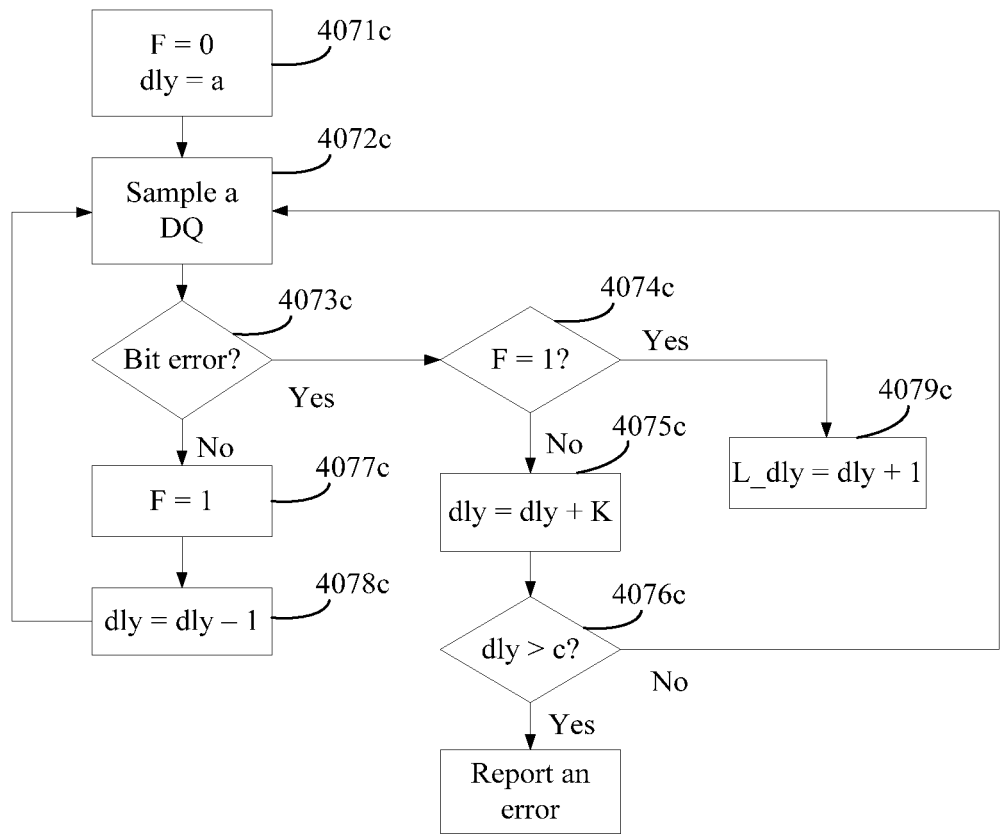
FIG. 15 is a flowchart of an algorithm for determining a start boundary moment of a timing margin of a first DQ according to an embodiment of this application.

FIG. 15 is a flowchart of an algorithm for determining a start boundary moment of a timing margin of a first DQ according to an embodiment of this application. The algorithm is described by using an example in which a first target reference moment is a, a second target reference moment is b, a first step length is K, and a second step length is 1. Referring to FIG. 15, the algorithm may include the following operations.

Operation 4071c: Adjust the moment dly of the edge of the first DQS to the first target reference moment a, and set an initial value of a flag bit F to 0. Then operation 4072c is performed.

The flag bit F may be used to indicate whether the moment dly of the edge of the first DQS before the adjustment is within the range of the timing margin of the first DQ. F=0 indicates that the moment dly of the edge of the first DQS before the adjustment is not within the range of the timing margin of the first DQ. F=1 indicates that the moment dly of the edge of the first DQS before the adjustment is within the range of the timing margin of the first DQ. For example, assuming a=24, the storage controller may adjust a timing of the first DQS, so that the edge of the first DQS is aligned with a reference moment 24, that is, dly=a=24.

Operation 4072c: Sample the first DQ based on a current reference voltage and the first DQS after the adjustment. Then operation 4073c is performed.

Operation 4073c: Detect whether a bit error exists in data obtained by decoding the first DQ.

After obtaining a sampled voltage by sampling the first DQ, the storage controller may decide the voltage obtained by sampling the DQ by using the voltage currently provided by the reference power source VREF as a decision level, and therefore obtain, by decoding the first DQ, data carried in the first DQ. If the storage controller detects that a bit error exists in the data obtained by decoding, the storage controller may determine that the current moment dly of the edge of the first DQS is not within the range of the timing margin of the first DQ. Therefore, the storage controller may continue to determine whether the moment dly of the edge of the first DQS before the adjustment is within the range of the timing margin of the first DQ, that is, perform operation 4074c. If the storage controller detects that no bit error exists in the data obtained by decoding, the storage controller may determine that the current moment dly of the edge of the first DQS is within the range of the timing margin of the first DQ. Therefore, the storage controller may continue to finely adjust the timing of the first DQS, that is, perform operation 4077c.

Operation 4074c: Detect whether the flag bit F is equal to 1. If F is not equal to 1, operation 4075c is performed; or if F is equal to 1, operation 4079c is performed.

Operation 4075c: Adjust the moment dly of the edge of the first DQS to dly+K. Then operation 4076c is performed.

If the storage controller detects, in the foregoing operation 4074c, that F is not equal to 1, it may be determined that the current moment dly of the edge of the first DQS is not within the range of the timing margin of the first DQ, and that the moment dly of the edge of the first DQS before the adjustment is not within the range of the timing margin of the first DQ either. Therefore, the moment of the edge of the first DQS may be first coarsely adjusted by using a first step length K as a unit. For example, assuming that a bit error exists in data obtained by sampling the first DQ when K=8 and the moment dly of the edge of the first DQS is equal to 24, the storage controller may coarsely adjust the timing of the first DQS rightward, so that the moment dly of the edge of the first DQS is updated to dly=24+8=32.

Operation 4076c: Detect whether the moment dly of the edge of the first DQS after the adjustment is later than the latest reference moment c in the reference moment set.

If dly>c, the storage controller may determine that the moment dly of the edge of the first DQS after the adjustment is beyond the preset reference moment set, that is, the first step length K is set to be excessively great. In this case, the storage controller may report an error (Error), and may readjust the first step length K. If dly≤c, the storage controller may continue to perform the foregoing operation 4072c, that is, continue to sample the first DQ based on the current reference voltage and the first DQS after the adjustment, and determine whether a bit error exists in the data obtained by decoding. For example, assuming c=320, because the updated dly is equal to 32, which is earlier than the latest reference moment c, the storage controller may continue to perform operation 4072c. If the first step length K=300, because the updated dly=24+300=324, which is later than the latest reference moment c, the storage controller may report an error.

Operation 4077c: Update the flag bit F to 1. Then operation 4078c is performed.

If the storage controller detects, in the foregoing operation 4073c, that no bit error exists in the data obtained by decoding, it may be determined that the current moment dly of the edge of the first DQS is within the range of the timing margin of the first DQ. Therefore, the flag bit F may be updated to 1.

Operation 4078c: Adjust the moment dly of the edge of the first DQS to dly−1. Then operation 4072c is performed.

After determining that the current moment dly of the edge of the first DQS is within the range of the timing margin of the first DQ, the storage controller may finely adjust the moment dly of the edge of the first DQS by using the second step length 1 as a unit. Then operation 4072c continues to be performed. For example, assuming that no bit error exists in the data obtained by decoding the first DQ at the moment dly=32 of the edge of the first DQS, the storage controller may determine that a left boundary of the first DQ is between 24 and 32. Therefore, the storage controller may update F to 1, and continue to finely adjust the moment of the edge of the first DQS leftward by using the first step length 1.

Operation 4079c: Determine the start boundary moment of the timing margin of the first DQ: L_dly=dly+1.

If the storage controller determines, in the foregoing operation 4074c, that the flag bit F is equal to 1, it may be determined that the current moment dly of the edge of the first DQS is not within the range of the timing margin of the first DQ, and that the moment dly of the edge of the first DQS before the adjustment is within the range of the timing margin of the first DQ. Therefore, it may be determined that the moment dly of the edge of the first DQS before the adjustment is the start boundary moment. Therefore, the start boundary moment L_dly may be determined as L_dly=dly+1.

For example, it is assumed that after the foregoing operations 4072c, 4073c, 4077c, and 4078c are performed repeatedly for a plurality of times, the storage controller adjusts the moment dly of the edge of the first DQS to dly=28 gradually by using the second step length 1 as a unit. If it is detected that a bit error exists in the data obtained by decoding the first DQ in this case, because the current flag bit F=1, the storage controller may determine that the moment dly of the edge of the first DQS before the adjustment (that is, when dly=29) is within the range of the timing margin of the first DQ, and therefore may determine that the moment dly of the edge of the first DQS before the adjustment is the start boundary moment L_dly of the timing margin of the first DQ, that is, may determine L_dly=28+1=29.

Figure 16:
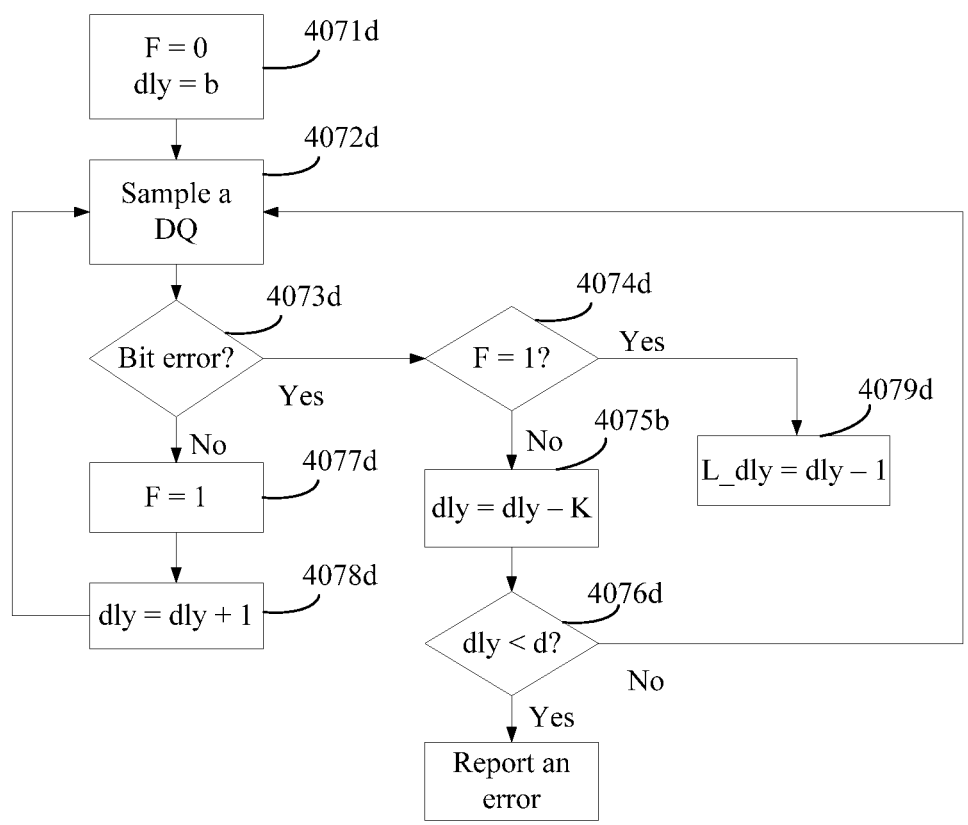
FIG. 16 is a flowchart of an algorithm for determining an end boundary moment of a timing margin of a first DQ according to an embodiment of this application.

FIG. 16 is a flowchart of an algorithm for determining an end boundary moment of a timing margin of a first DQ according to an embodiment of this application. The algorithm is described by using an example in which a first target reference moment is a, a second target reference moment is b, a first step length is K, and a second step length is 1. Referring to FIG. 16, the algorithm may include the following operations.

Operation 4071d: Adjust the moment dly of the edge of the first DQS to the second target reference moment b, and set an initial value of a flag bit F to 0. Then operation 4072d is performed.

The flag bit F may be used to indicate whether the moment dly of the edge of the first DQS before the adjustment is within the range of the timing margin of the first DQ. F=0 indicates that the moment dly of the edge of the first DQS before the adjustment is not within the range of the timing margin of the first DQ. F=1 indicates that the moment dly of the edge of the first DQS before the adjustment is within the range of the timing margin of the first DQ. For example, assuming b=320, the storage controller may adjust a timing of the first DQS, so that the edge of the first DQS is aligned with a reference moment 320, that is, dly=b=320.

Operation 4072d: Sample the first DQ based on a current reference voltage and the first DQS after the adjustment. Then operation 4073d is performed.

Operation 4073d: Detect whether a bit error exists in data obtained by decoding the first DQ.

After obtaining a sampled voltage by sampling the first DQ, the storage controller may decide the sampled voltage by using the voltage provided by the reference power source VREF as a decision level, and therefore obtain, by decoding the first DQ, data carried in the first DQ.

If the storage controller detects that a bit error exists in the data obtained by decoding, the storage controller may determine that the current moment dly of the edge of the first DQS is not within the range of the timing margin of the first DQ. Therefore, the storage controller may continue to determine whether the moment dly of the edge of the first DQS before the adjustment is within the range of the timing margin of the first DQ, that is, perform operation 4074d.

If the storage controller detects that no bit error exists in the data obtained by decoding, the storage controller may determine that the current moment dly of the edge of the first DQS is within the range of the timing margin of the first DQ. Therefore, the storage controller may continue to finely adjust the timing of the first DQS, that is, perform operation 4077d.

Operation 4074d: Detect whether the flag bit F is equal to 1. If F is not equal to 1, operation 4075d is performed; or if F is equal to 1, operation 4079d is performed.

Operation 4075d: Adjust the moment dly of the edge of the first DQS to dly-K. Then operation 4076d is performed.

If the storage controller detects, in the foregoing operation 4074d, that F is not equal to 1, it may be determined that the current moment dly of the edge of the first DQS is not within the range of the timing margin of the first DQ, and that the moment dly of the edge of the first DQS before the adjustment is not within the range of the timing margin of the first DQ either. Therefore, the moment of the edge of the first DQS may be first coarsely adjusted by using the first step length K as a unit. For example, assuming that a bit error exists in data obtained by sampling the first DQ when K=8 and the moment dly of the edge of the first DQS is equal to 320, the storage controller may coarsely adjust the timing of the first DQS leftward, so that the moment dly of the edge of the first DQS is updated to: dly=320−8=312.

Operation 4076d: Detect whether the moment dly of the edge of the first DQS after the adjustment is earlier than the earliest reference moment d in the reference moment set.

If dly<d, the storage controller may determine that the moment dly of the edge of the first DQS after the adjustment is beyond the preset reference moment set, that is, the first step length K is set to be excessively great. In this case, the storage controller may report an error (Error), and may readjust the first step length K. If dly≥d, the storage controller may continue to perform the foregoing operation 4072d, that is, continue to sample the first DQ based on the current reference voltage and the first DQS after the adjustment, and determine whether a bit error exists in the data obtained by decoding. For example, assuming d=20, because the updated dly is equal to 312, which is later than the earliest reference moment d, the storage controller may continue to perform operation 4072d. If the first step length K=310, because the updated dly=320−310=10, which is earlier than the earliest reference moment d, the storage controller may report an error.

Operation 4077d: Update the flag bit F to 1. Then operation 4078d is performed.

If the storage controller detects, in the foregoing operation 4073d, that no bit error exists in the data obtained by decoding, it may be determined that the current moment dly of the edge of the first DQS is within the range of the timing margin of the first DQ. Therefore, the flag bit F may be updated to 1.

Operation 4078d: Adjust the moment dly of the edge of the first DQS to dly+1. Then operation 4072d is performed.

After determining that the current moment dly of the edge of the first DQS is within the range of the timing margin of the first DQ, the storage controller may finely adjust the moment dly of the edge of the first DQS by using the second step length 1 as a unit. Then operation 4072d continues to be performed. For example, assuming that after the storage controller adjusts the moment dly of the edge of the first DQS to dly=304 by performing operation 4075b twice, no bit error exists in the data obtained by decoding the first DQ, the storage controller may determine that a left boundary of the first DQ is between 304 and 312. Therefore, the storage controller may update F to 1, and continue to finely adjust the moment of the edge of the first DQS rightward by using the first step length 1.

Operation 4079d: Determine the end boundary moment of the timing margin of the first DQ: L_dly=dly−1.

If the storage controller determines, in the foregoing operation 4074d, that the flag bit F is equal to 1, it may be determined that the current moment dly of the edge of the first DQS is not within the range of the timing margin of the first DQ, and that the moment dly of the edge of the first DQS before the adjustment is within the range of the timing margin of the first DQ. Therefore, it may be determined that the moment dly of the edge of the first DQS before the adjustment is the end boundary moment. Therefore, the end boundary moment L_dly may be determined as L_dly=dly−1.

For example, it is assumed that after the foregoing operations 4072d, 4073d, 4077d, and 4078d are performed repeatedly for a plurality of times, the storage controller adjusts the moment dly of the edge of the first DQS to dly=308 gradually by using the second step length 1 as a unit. If it is detected that a bit error exists in the data obtained by decoding the first DQ in this case, because the current flag bit F=1, the storage controller may determine that the moment dly of the edge of the first DQS before the adjustment (that is, when dly=307) is within the range of the timing margin of the first DQ, and therefore may determine that the moment dly of the edge of the first DQS before the adjustment is the end boundary moment L_dly of the timing margin of the first DQ, that is, may determine L_dly=308−1=307.

After the timing margin of the first DQ in the read direction is detected by using the method shown in the foregoing operation 407, the storage controller may calibrate a related parameter of the storage device based on the timing margin of the first DQ, to ensure that the timing margin of the DQ in the read direction can ensure correct decoding of the data, that is, ensure that the storage controller can correctly read the data.

In the process of determining the margins of the DQ, if the storage controller first fixes the moment of the edge of the DQS to a reference moment and then detects a voltage margin of the DQ at the reference moment, when the storage controller determines a start boundary voltage of the voltage margin, the storage controller may also determine the start boundary voltage by referring to the method shown in operation 4071a to operation 4075a or the method shown in operation 4071c to operation 4079c. When the storage controller determines an end boundary voltage of the voltage margin, the storage controller may also determine the end boundary voltage by referring to the method shown in operation 4071b to 4075b or the method shown in operation 4071d to operation 4079d. Details are not described again herein in an embodiment of the application.

Operation 408: Write second test data to the storage medium at a second target rate.

After the timing margin of the first DQ in the read direction is detected, the storage controller may continue to detect a timing margin of a DQ in a write direction. In an embodiment of the application, the storage controller may first determine a current data transmission rate when the NFI bus works normally, and then may write the second test data to the storage medium by using the data transmission rate during normal working as the second target rate. The second test data may also be data prestored in the storage controller, or may be data customized by the developer. In addition, the second test data may be the same as or different from the first test data.

Operation 409: Transmit, to the storage medium, an instruction for reading the second test data.

Operation 410: Receive a second DQ carrying the second test data, and a second DQS that are transmitted by the storage medium.

Operation 411: Within the range of the plurality of reference moments included in the reference moment set, adjust a moment of an edge of the second DQS, and detect whether a bit error exists in data obtained by decoding the second DQ based on the current reference voltage and the second DQS after the adjustment, to determine a start boundary moment and an end boundary moment of a timing margin of the second DQ separately from the plurality of reference moments. Then operation 402 is performed.

Because after the foregoing operation 407, a parameter-based adjustment operation can ensure reliability of the test data read by the storage controller, the storage controller can detect, by using the read test data, whether a bit error exists in the written second test data. In an embodiment, the storage controller may detect whether a bit error exists in the data obtained by decoding the second DQ, and implement detection of the timing margin of the DQ in the write direction. For the process of detecting the timing margin of the second DQ shown in operation 408 to operation 411, refer to the process of detecting the timing margin of the first DQ shown in operation 404 to operation 407. Details are not described again herein.

After determining the timing margin of the second DQ, the storage controller may continue to perform operation 402, that is, continue to adjust the voltage of the reference power source VREF and continue to detect timing margins of the first DQ and the second DQ, until the voltage of the reference power source VREF traverses the reference voltage set. After the voltage of the reference power source VREF traverses the reference voltage set, the storage controller may obtain the timing margin of the first DQ (that is, the DQ in the read direction) and the timing margin of the second DQ (that is, the DQ in the write direction) under each reference voltage in the reference voltage set.

Operation 412: Generate a schematic diagram of two-dimensional margins of the first DQ and a schematic diagram of two-dimensional margins of the second DQ separately.

Figure 17:
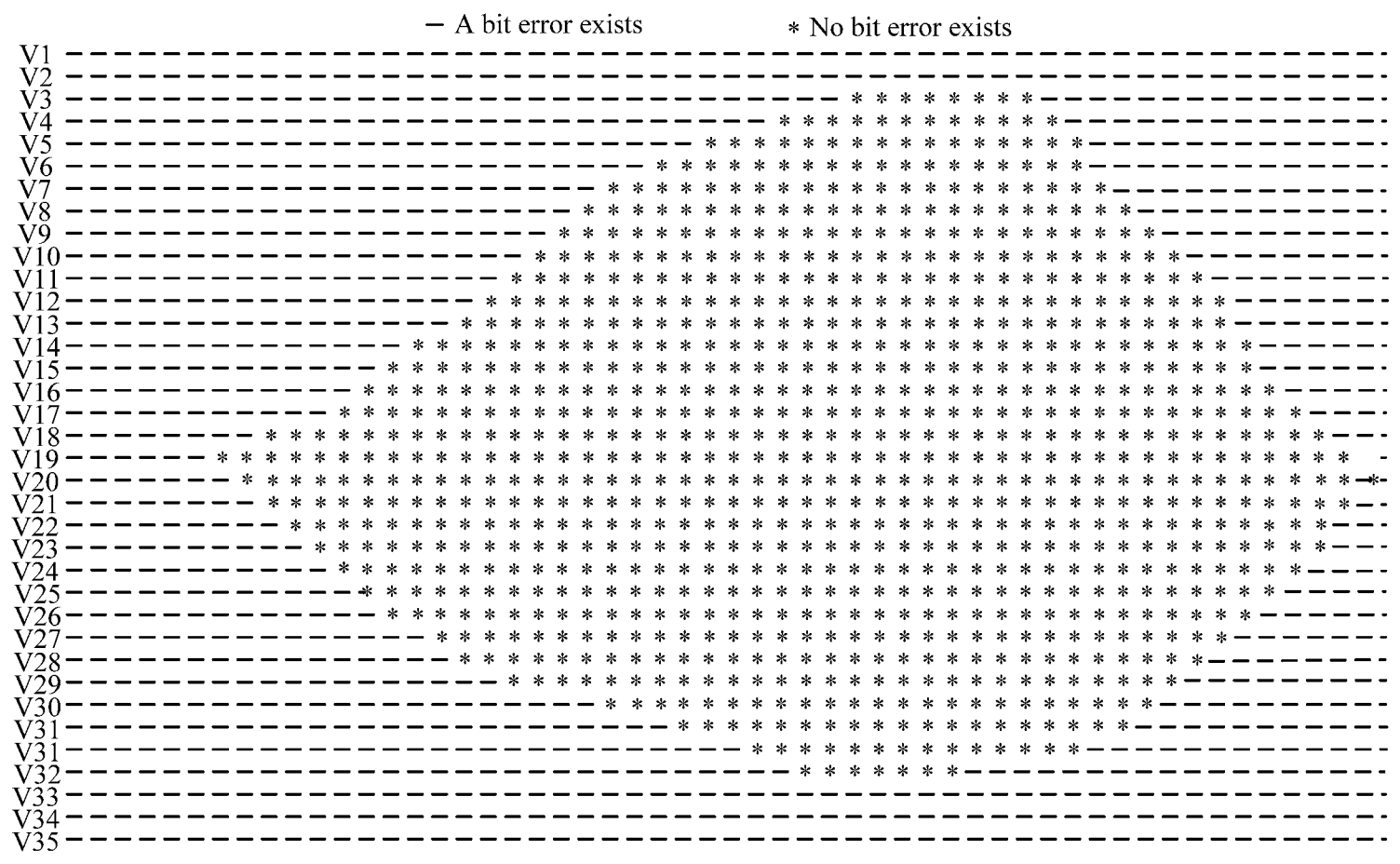

A horizontal axis of the schematic diagram of the two-dimensional margins may be used to indicate the moment of the edge of the DQS, a vertical axis may be used to indicate the voltage of the reference power source VREF, and different graphical symbols may be used at each coordinate point in the schematic diagram to indicate whether a bit error exists in data obtained by decoding at the coordinate point. For example, assuming that the reference voltage set includes 35 reference voltages, that is, V1 to V35, the schematic diagram of the two-dimensional margins of the first DQ that is generated by the storage controller may be shown in FIG. 17. In the schematic diagram, "*" is used to indicate that no bit error exists in the data obtained by decoding, and "−" is used to indicate that a bit error exists in the data obtained by decoding. As can be seen with reference to FIG. 17, when the voltage of the reference power source VREF is a reference voltage V19, the range of the timing margin of the first DQ is the largest.

Because the storage controller 01 may be connected to a plurality of storage media 02 by using a plurality of NFI buses 03, in the foregoing operation 401, the storage controller may detect physical parameters of each NFI bus 03 and a storage medium 02 connected to each NFI bus 03, and perform detection on a storage medium 02 that meets the detection trigger condition. Normal reading and writing can be performed on other storage media 02 that do not meet the detection trigger condition, to ensure non-interruption of a service.

Order of operations of the method for detecting margins of a DQ according to an embodiment of the application may be properly adjusted, and operations may also be correspondingly added or deleted according to a situation. For example, operation 412 may be deleted according to a situation. Alternatively, operation 408 to operation 411 may be performed after operation 412. In an embodiment, the schematic diagram of the two-dimensional margins of the first DQ may be first generated, and then operation 402, operation 403, and operation 408 to operation 412 are performed to generate the schematic diagram of the two-dimensional margins of the second DQ. Alternatively, if only the two-dimensional margins of the first DQ are detected, operation 404 may also be performed before operation 402. Likewise, if only the two-dimensional margins of the second DQ are detected, operation 408 may also be performed before operation 402. Any variation of the method readily figured out by one of ordinary skilled in the art within the technical scope disclosed in this application shall fall within the protection scope of this application. Therefore, details are not described herein.

As described above, an embodiment of the application provides a method for detecting margins of a data signal. A receive end of the DQ may automatically detect the timing margin and voltage margin of the DQ by adjusting the voltage of the reference power source and the timing of the DQS. In the detection process, no other external detection device needs to be connected, and no parameter needs to be manually adjusted. Therefore, detection efficiency is effectively improved, and detection costs are reduced. In addition, because the timing margin and the voltage margin are determined by the storage controller based on whether a bit error exists in data actually obtained by decoding, reliability of the detection result can be ensured.

Figure 18:
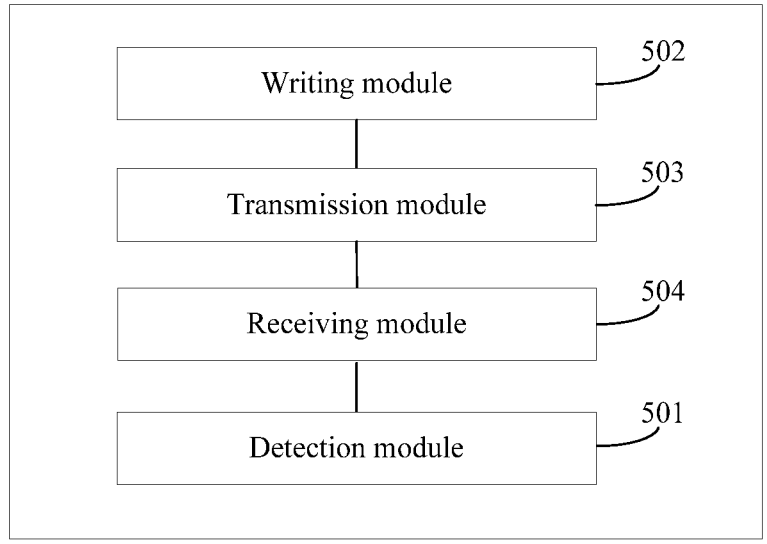
FIG. 18 is a structural block diagram of an apparatus for detecting margins of a data signal according to an embodiment of this application.
Figure 19:
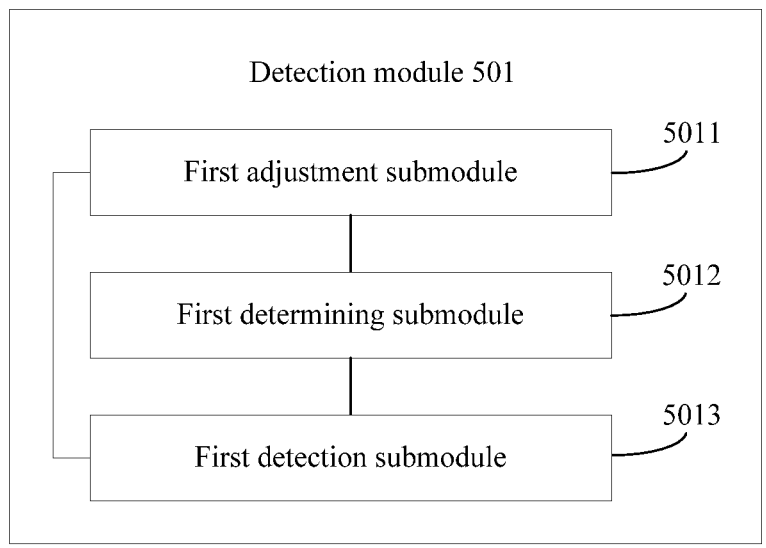
FIG. 19 is a schematic structural diagram of a detection module according to an embodiment of this application.

FIG. 18 is a structural block diagram of an apparatus for detecting margins of a data signal according to an embodiment of this application. The apparatus may be configured at a receive end of a data signal in a storage device. For example, referring to FIG. 1, the apparatus may be configured in the storage controller 01. As shown in FIG. 18, the apparatus may include a detection module 501. The detection module 501 may be configured to implement the method shown in operation 101 to operation 103 in the foregoing method embodiment. FIG. 19 is a schematic structural diagram of a detection module according to an embodiment of this application. As shown in FIG. 19, the detection module 501 may include:

a first adjustment submodule 5011, which may be configured to implement the method shown in operation 201 or operation 402 in the foregoing method embodiment;

a first determining submodule 5012, which may be configured to implement the method shown in operation 204 and operation 206, or operation 407 and operation 411 in the foregoing method embodiment; and a first detection submodule 5013, configured to instruct the first adjustment submodule 5011 and the first determining submodule 5012 to repeat the operations of adjusting the voltage and determining the timing margin, until the voltage of the reference power source traverses the reference voltage set, where for function implementation of the first detection submodule 5013, reference may be made to related descriptions of operation 202 or operation 403 in the foregoing method embodiment.

In an embodiment, the first determining submodule 5012 may be configured to implement the method shown in operation 4071a to operation 4075a in the foregoing method embodiment, the method shown in operation 4071b to operation 4075b in the foregoing method embodiment, the method shown in operation 4071c to operation 4079c in the foregoing method embodiment, and the method shown in operation 4071d to operation 4079d in the foregoing method embodiment.

Figure 20:
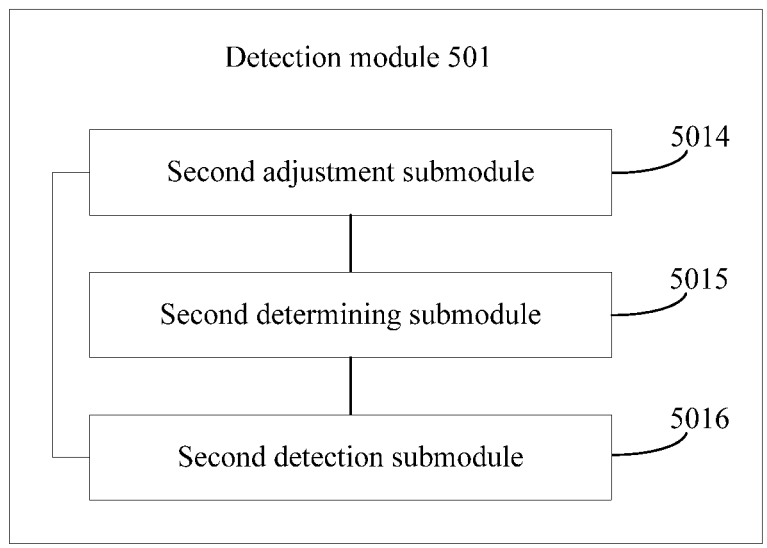
FIG. 20 is a schematic structural diagram of another detection module according to an embodiment of this application.

FIG. 20 is a schematic structural diagram of another detection module according to an embodiment of this application. As shown in FIG. 20, the detection module 501 may include:

a second adjustment submodule 5014, configured to adjust the moment of the edge of the data strobe signal transmitted by the storage medium, to one reference moment in the plurality of reference moments, where for function implementation of the second adjustment submodule 5014, reference may be made to related descriptions of operation 302 and operation 308 in the foregoing method embodiment;

a second determining submodule 5015, configured to: within a range of the plurality of reference voltages included in the reference voltage set, adjust the voltage of the reference power source, and detect whether a bit error exists in data obtained by decoding, based on the current reference moment and the voltage of the reference power source after the adjustment, the data signal transmitted by the storage medium, to obtain a start boundary voltage and an end boundary voltage of the voltage margin of the data signal, where the start boundary voltage is a lowest reference voltage that enables the data obtained by decoding to be free of bit errors, in the plurality of reference voltages, and the end boundary voltage is a highest reference voltage that enables the data obtained by decoding to be free of bit errors, in the plurality of reference voltages; and for function implementation of the second determining submodule 5015, reference may be made to related descriptions of operation 304 and operation 310 in the foregoing method embodiment; and a second detection submodule 5016, configured to instruct the second adjustment submodule 5014 and the second determining submodule 5015 to repeat the operations of adjusting the moment and determining the voltage margin, until the moment of the edge of the data strobe signal traverses the reference moment set, where for function implementation of the second detection submodule 5016, reference may be made to related descriptions of operation 303 and operation 309 in the foregoing method embodiment.

In an embodiment, the receive end may be the storage controller, the transmit end may be the storage medium, and the storage controller is connected to the storage medium by using an interface bus. Referring to FIG. 18, the apparatus may further include:

a writing module 502, which may be configured to implement the method shown in operation 203 and operation 205, or operation 301 and operation 307, or operation 404 and operation 408 in the foregoing method embodiment;

a transmission module 503, which may be configured to implement the method shown in operation 405 and operation 409 in the foregoing method embodiment; and a receiving module 504, which may be configured to implement the method shown in operation 406 and operation 410 in the foregoing method embodiment.

In an embodiment, for function implementation of the detection module 501, reference may be made to related descriptions of operation 401 in the foregoing method embodiment.

As described above, an embodiment of the application provides an apparatus for detecting margins of a data signal. The apparatus may automatically detect the timing margin and voltage margin of the DQ by adjusting the voltage of the reference power source and the timing of the DQS. In the detection process, no other external detection device needs to be connected, and no parameter needs to be manually adjusted. Therefore, detection efficiency is effectively improved, and detection costs are reduced. In addition, because the timing margin and the voltage margin are determined by the storage controller based on whether a bit error exists in data actually obtained by decoding, reliability of the detection result can be ensured.

It may be clearly understood by one or ordinary skilled in the art that, for the purpose of convenient and brief description, for a detailed working process of the foregoing apparatus and module, refer to a corresponding process in the foregoing method embodiment, and details are not described again herein.

It should be understood that the apparatus for detecting margins of a data signal in an embodiment of the application may be further implemented by using an application-specific integrated circuit (ASIC), or implemented by using a programmable logic device (PLD). The PLD may be a complex programmable logical device (CPLD), a field programmable gate array (FPGA), generic array logic (GAL), or any combination thereof. Alternatively, the method for detecting margins of a DQ according to the foregoing method embodiment may be implemented by software. When the method for detecting margins of a DQ according to the foregoing method embodiment is implemented by software, each module in the apparatus for detecting margins of a data signal may also be a software module.

Figure 21:
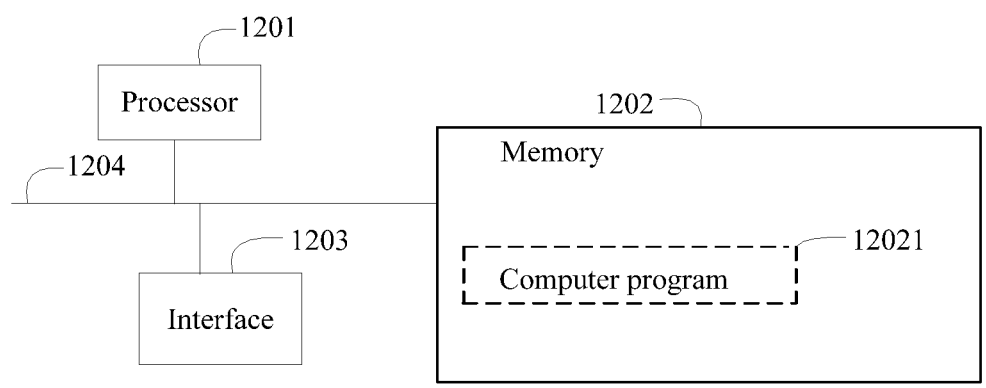
FIG. 21 is a structural block diagram of another apparatus for detecting margins of a data signal according to an embodiment of this application.

FIG. 21 is a structural block diagram of another apparatus for detecting margins of a data signal according to an embodiment of this application. Referring to FIG. 21, the apparatus may include a processor 1201, a memory 1202, an interface 1203, and a bus 1204. The bus 1204 is configured to interconnect the processor 1201, the memory 1202, and the interface 1203. Communications connections with other components may be implemented by using the interface 1203 (wired or wireless). The memory 1202 stores a computer program 12021, where the computer program 12021 is used to implement various application functions.

It should be understood that in an embodiment of the application, the processor 1201 may be a CPU, or the processor 1201 may be another general purpose processor, a digital signal processor (DSP), an application-specific integrated circuit (ASIC), a field programmable gate array (FPGA), a GPU, or another programmable logic device, discrete gate or transistor logic device, discrete hardware component, or the like. The general purpose processor may be a microprocessor or any conventional processor or the like.

The memory 1202 may be a non-volatile memory. The non-volatile memory may be a read-only memory (ROM), a programmable read-only memory (programmable ROM, PROM), an erasable programmable read-only memory (erasable PROM, EPROM), an electrically erasable programmable read-only memory (electrically EPROM, EEPROM), or a flash memory.

The bus 1204 may further include a power bus, a control bus, a status signal bus, and the like, in addition to a data bus. However, for clear description, various types of buses in the figure are marked as the bus 1204.

The processor 1201 is configured to execute the computer program stored in the memory 1202, and the processor 1201 implements operations in the foregoing method embodiment by executing the computer program 12021.

An embodiment of this application further provides a chip. The chip may include a programmable logic circuit and/or a program instruction, and when the chip runs, the chip is configured to implement the method for detecting margins of a DQ according to the foregoing method embodiment.

An embodiment of this application further provides a computer program product including an instruction. When the computer program product runs on a processor, the processor is enabled to perform operations in the foregoing method embodiment.

An embodiment of this application further provides a storage device. As shown in FIG. 1, the storage device may include a storage controller 01 and one or more storage media 02. An IO interface 021 of each storage medium 02 may be connected to one 10 interface 011 of the storage controller 01 by using an NFI bus 03, and a reference power source VREF of the storage controller 01 may be connected to each storage medium 02. The storage controller 01 and/or the storage medium 02 may include the apparatus for detecting margins of a DQ according to the foregoing embodiment, or may be a chip provided by the foregoing embodiment.

In the embodiments of this application, the term "at least one" indicates one or more, and the term "a plurality of" indicates two or more. The term "and/or" describes an association relationship for describing associated objects and represents that three relationships may exist. For example, A and/or B may represent the following cases: Only A exists, both A and B exist, and only B exists, where A and B may be in a singular or plural form. The character "/" generally indicates an "or" relationship between the associated objects.

The foregoing descriptions are merely optional embodiments of this application, but are not intended to limit this application. Any modification, equivalent replacement, or improvement made without departing from the principle of this application should fall within the protection scope of this application.

What is claimed is:

1. A method for detecting margins of a data signal by a receiving end of the data signal, comprising:
    adjusting a voltage of a reference power source based on a plurality of reference voltages comprised in a reference voltage set;
    adjusting, based on a plurality of reference moments comprised in a reference moment set, a moment of an edge of a data strobe signal transmitted by a transmitting end of the data signal, wherein the transmitting end is a storage medium and before adjusting the moment of the edge of the data strobe signal, the receiving end writes test data to the storage medium at a target rate, transmits to the storage medium an instruction for reading the test data, and receives the data signal carrying the test data and the data strobe signal transmitted by the storage medium; and
    for each reference voltage and each reference moment, determining whether a bit error exists in data obtained by decoding the data signal when the voltage of the reference power source is the reference voltage and the moment of the edge of the data strobe signal is the reference moment, to obtain a timing margin of the data signal at each reference voltage and a voltage margin of the data signal at each reference moment, wherein
    the timing margin is a range of reference moments that enable the data obtained by decoding to be free of bit errors, in the plurality of reference moments, and the voltage margin is a range of reference voltages that enable the data obtained by decoding to be free of bit errors, in the plurality of reference voltages.

2. The method according to claim 1, wherein the receiving end comprises a register and a bleeder circuit, wherein a control end of the bleeder circuit is connected to the register, and wherein an output end of the bleeder circuit is connected to the reference power source; and wherein the adjusting the voltage of the reference power source comprises:
adjusting a value of the register, to adjust an output voltage of the bleeder circuit.

3. The method according to claim 1, wherein the receiving end comprises a delay line connected to a latch used for latching the data strobe signal and to an input/output interface of the receiving end separately; and
wherein the adjusting the moment of the edge of the data strobe signal transmitted by the transmitting end of the data signal comprises:
adjusting a parameter of the delay line, to adjust the moment of the edge of the data strobe signal transmitted by the transmitting end of the data signal.

4. The method according to claim 1, wherein a process of detecting the timing margin of the data signal at each reference voltage and the voltage margin of the data signal at each reference moment comprises:
adjusting the voltage of the reference power source to one reference voltage in the reference voltage set;
within a range of the plurality of reference moments comprised in the reference moment set, adjusting the moment of the edge of the data strobe signal transmitted by the transmitting end of the data signal, and detecting whether a bit error exists in data obtained by decoding the data signal based on a current reference voltage and the data strobe signal after the adjustment, to determine a start boundary moment and an end boundary moment of the timing margin of the data signal separately from the plurality of reference moments; and
adjusting the voltage and determining the timing margin until the voltage of the reference power source traverses the reference voltage set, wherein
the start boundary moment is an earliest reference moment that enables the data obtained by decoding to be free of bit errors, in the plurality of reference moments, and the end boundary moment is a latest reference moment that enables the data obtained by decoding to be free of bit errors, in the plurality of reference moments.

5. The method according to claim 4, wherein the plurality of reference moments are arranged in ascending order, and within the range of the plurality of reference moments comprised in the reference moment set, the adjusting the moment of the edge of the data strobe signal transmitted by the transmitting end of the data signal, and detecting whether the bit error exists in data obtained by decoding the data signal based on the current reference voltage and the data strobe signal after the adjustment, to determine the start boundary moment of the timing margin of the data signal from the plurality of reference moments comprises:
adjusting the moment of the edge of the data strobe signal transmitted by the transmitting end of the data signal, to a first target reference moment in the plurality of reference moments, wherein the first target reference moment is an $X^{th}$ reference moment in the plurality of reference moments, wherein X is a positive integer less than M/2, and wherein M is a total quantity of reference moments comprised in the reference moment set;
detecting whether a bit error exists in data obtained by decoding the data signal based on the current reference voltage and the data strobe signal after the adjustment;
if the bit error exists, setting forward the moment of the edge of the data strobe signal by a first step length, until no bit error exists in data obtained by decoding based on the current reference voltage and the data strobe signal after the adjustment;
setting back the moment of the edge of the data strobe signal by a second step length, until a bit error exists in data obtained by decoding based on the current reference voltage and the data strobe signal after the adjustment; and
determining a reference moment next to the moment of the edge of the data strobe signal after the adjustment as the start boundary moment of the timing margin of the data signal, wherein
the second step length is equal to a time difference between two adjacent reference moments, and the first step length is greater than the second step length and is an integer multiple of the second step length.

6. The method according to claim 4, wherein the plurality of reference moments are arranged in an ascending order, and within the range of the plurality of reference moments comprised in the reference moment set, the adjusting the moment of the edge of the data strobe signal transmitted by the transmitting end of the data signal, and detecting whether the bit error exists in data obtained by decoding the data signal based on the current reference voltage and the data strobe signal after the adjustment, to determine the end boundary moment of the timing margin of the data signal from the plurality of reference moments comprises:
adjusting the moment of the edge of the data strobe signal transmitted by the transmitting end of the data signal, to a second target reference moment in the plurality of reference moments, wherein the second target reference moment is a $Y^{th}$ reference moment in the plurality of reference moments, wherein Y is a positive integer greater than M/2, and wherein M is a total quantity of reference moments comprised in the reference moment set;
detecting whether a bit error exists in data obtained by decoding the data signal based on the current reference voltage and the data strobe signal after the adjustment;
if the bit error exists, setting back the moment of the edge of the data strobe signal by a first step length, until no bit error exists in data obtained by decoding based on the current reference voltage and the data strobe signal after the adjustment;
setting forward the moment of the edge of the data strobe signal by a second step length, until a bit error exists in data obtained by decoding based on the current reference voltage and the data strobe signal after the adjustment; and
determining a reference moment previous to the moment of the edge of the data strobe signal after the adjustment as the end boundary moment of the timing margin of the data signal, wherein
the second step length is equal to a time difference between two adjacent reference moments, and the first step length is greater than the second step length and is an integer multiple of the second step length.

7. The method according to claim 1, wherein the adjusting the voltage of the reference power source based on the plurality of reference voltages comprised in the reference voltage set; adjusting, based on the plurality of reference moments comprised in the reference moment set, the moment of the edge of the data strobe signal transmitted by the transmitting end of the data signal; and for each reference voltage and each reference moment, determining whether the bit error exists in data obtained by decoding the data signal when the voltage of the reference power source is the reference voltage and the moment of the edge of the data strobe signal is the reference moment, to obtain the timing margin of the data signal at each reference voltage and the voltage margin of the data signal at each reference moment, comprise:

adjusting the moment of the edge of the data strobe signal transmitted by the transmitting end of the data signal, to one reference moment in the plurality of reference moments;

within the range of the plurality of reference voltages comprised in the reference voltage set, adjusting the voltage of the reference power source, and detecting whether a bit error exists in data obtained by decoding the data signal based on a current reference moment and the voltage of the reference power source after the adjustment, to determine a start boundary voltage and an end boundary voltage of the voltage margin of the data signal separately from the plurality of reference voltages; and adjusting the moment and determining the voltage margin, until the moment of the edge of the data strobe signal traverses the reference moment set, wherein the start boundary voltage is a lowest reference voltage that enables the data obtained by decoding to be free of bit errors, in the plurality of reference voltages, and the end boundary voltage is a highest reference voltage that enables the data obtained by decoding to be free of bit errors, in the plurality of reference voltages.

8. The method according to claim 1, wherein the receiving end is a storage controller and the storage controller is connected to the storage medium by using an interface bus; and wherein the target rate is a working rate of the interface bus or is a lower limit rate within a bus rate range corresponding to a working mode of the interface bus.

9. The method according to claim 1, wherein the adjusting the voltage of the reference power source based on the plurality of reference voltages comprised in the reference voltage set comprises:

adjusting the voltage of the reference power source in response to a detection instruction based on the plurality of reference voltages comprised in the reference voltage set; or if detecting that a physical parameter of a storage device meets a detection trigger condition, adjusting the voltage of the reference power source based on the plurality of reference voltages comprised in the reference voltage set.

10. An apparatus for detecting margins of a data signal by a receiving end of the data signal, wherein the apparatus comprises a detection module configured to:

adjust a voltage of a reference power source based on a plurality of reference voltages comprised in a reference voltage set;

adjust, based on a plurality of reference moments comprised in a reference moment set, a moment of an edge of a data strobe signal transmitted by a transmitting end of the data signal, wherein the transmitting end is a storage medium and before adjusting the moment of the edge of the data strobe signal, the receiving end writes test data to the storage medium at a target rate, transmits to the storage medium an instruction for reading the test data, and receives the data signal carrying the test data and the data strobe signal transmitted by the storage medium; and for each reference voltage and each reference moment, determine whether a bit error exists in data obtained by decoding the transmitted data signal when the voltage of the reference power source is the reference voltage and the moment of the edge of the data strobe signal is the reference moment, to obtain a timing margin of the data signal at each reference voltage and a voltage margin of the data signal at each reference moment, wherein the timing margin is a range of reference moments that enable the data obtained by decoding to be free of bit errors, in the plurality of reference moments, and the voltage margin is a range of reference voltages that enable the data obtained by decoding to be free of bit errors, in the plurality of reference voltages.

11. The apparatus according to claim 10, wherein the receiving end comprises a register and a bleeder circuit, wherein a control end of the bleeder circuit is connected to the register, and wherein an output end of the bleeder circuit is connected to the reference power source; and wherein the detection module is configured to:

adjust a value of the register, to adjust an output voltage of the bleeder circuit.

12. The apparatus according to claim 10, wherein the receiving end comprises a delay line connected to a latch used for latching the data strobe signal and to an input/output interface of the receiving end separately; and wherein the detection module is configured to:

adjust a parameter of the delay line, to adjust the moment of the edge of the data strobe signal transmitted by the transmitting end of the data signal.

13. The apparatus according to claim 10, wherein the detection module comprises:

a first adjustment submodule configured to adjust the voltage of the reference power source to one reference voltage in the reference voltage set;

a first determining submodule configured to:

within a range of the plurality of reference moments comprised in the reference moment set, adjust the moment of the edge of the data strobe signal transmitted by the transmitting end of the data signal, and detect whether a bit error exists in data obtained by decoding the data signal based on a current reference voltage and the data strobe signal after the adjustment, to determine a start boundary moment and an end boundary moment of the timing margin of the data signal separately from the plurality of reference moments; and a first detection submodule configured to instruct the first adjustment submodule and the first determining submodule to repeat adjusting the voltage and determining the timing margin, until the voltage of the reference power source traverses the reference voltage set, wherein the start boundary moment is an earliest reference moment that enables the data obtained by decoding to be free of bit errors, in the plurality of reference moments, and the end boundary moment is a latest reference moment that enables the data obtained by decoding to be free of bit errors, in the plurality of reference moments.

14. The apparatus according to claim 13, wherein the plurality of reference moments are arranged in ascending order; and wherein the first determining submodule is configured to:

adjust the moment of the edge of the data strobe signal transmitted by the transmitting end of the data signal, to a first target reference moment in the plurality of reference moments, wherein the first target reference moment is an $X^{th}$ reference moment in the plurality of reference moments, wherein X is a positive integer less than M/2, and wherein M is a total quantity of reference moments comprised in the reference moment set;

detect whether a bit error exists in data obtained by decoding the data signal based on the current reference voltage and the data strobe signal after the adjustment;

if the bit error exists, set forward the moment of the edge of the data strobe signal by a first step length, until no bit error exists in data obtained by decoding based on the current reference voltage and the data strobe signal after the adjustment;

set back the moment of the edge of the data strobe signal by a second step length, until a bit error exists in data obtained by decoding based on the current reference voltage and the data strobe signal after the adjustment; and determine a reference moment next to the moment of the edge of the data strobe signal after the adjustment as the start boundary moment of the timing margin of the data signal, wherein the second step length is equal to a time difference between two adjacent reference moments, and the first step length is greater than the second step length and is an integer multiple of the second step length.

15. The apparatus according to claim 13, wherein the plurality of reference moments are arranged in ascending order; and wherein the first determining submodule is configured to:

adjust the moment of the edge of the data strobe signal transmitted by the transmitting end of the data signal, to a second target reference moment in the plurality of reference moments, wherein the second target reference moment is a $Y^{th}$ reference moment in the plurality of reference moments, wherein Y is a positive integer greater than M/2, and wherein M is a total quantity of reference moments comprised in the reference moment set;

detect whether a bit error exists in data obtained by decoding the data signal based on the current reference voltage and the data strobe signal after the adjustment;

if the bit error exists, set back the moment of the edge of the data strobe signal by a first step length, until no bit error exists in data obtained by decoding based on the current reference voltage and the data strobe signal after the adjustment;

set forward the moment of the edge of the data strobe signal by a second step length, until a bit error exists in data obtained by decoding based on the current reference voltage and the data strobe signal after the adjustment; and determine a reference moment previous to the moment of the edge of the data strobe signal after the adjustment as the end boundary moment of the timing margin of the data signal, wherein the second step length is equal to a time difference between two adjacent reference moments, and the first step length is greater than the second step length and is an integer multiple of the second step length.

16. The apparatus according to claim 10, wherein the detection module comprises:

a second adjustment submodule configured to adjust the moment of the edge of the data strobe signal transmitted by the transmitting end of the data signal, to one reference moment in the plurality of reference moments;

a second determining submodule configured to:

within a range of the plurality of reference voltages comprised in the reference voltage set, adjust the voltage of the reference power source, and detect whether a bit error exists in data obtained by decoding the data signal based on a current reference moment and the voltage of the reference power source after the adjustment, to determine a start boundary voltage and an end boundary voltage of the voltage margin of the data signal separately from the plurality of reference voltages; and a second detection submodule configured to instruct the second adjustment submodule and the second determining submodule to repeat adjusting the moment and determining the voltage margin, until the moment of the edge of the data strobe signal traverses the reference moment set, wherein the start boundary voltage is a lowest reference voltage that enables the data obtained by decoding to be free of bit errors, in the plurality of reference voltages, and the end boundary voltage is a highest reference voltage that enables the data obtained by decoding to be free of bit errors, in the plurality of reference voltages.

17. The apparatus according to claim 10, wherein the receiving end is a storage controller and the storage controller is connected to the storage medium by using an interface bus; and the apparatus further comprises:

a writing module configured to write the test data to the storage medium at the target rate;

a transmission module configured to transmit, to the storage medium, the instruction for reading the test data; and a receiving module configured to receive the data signal carrying the test data, and the data strobe signal that are transmitted by the storage medium, wherein the target rate is a working rate of the interface bus or is a lower limit rate within a bus rate range corresponding to a working mode of the interface bus.

18. The apparatus according to claim 10, wherein the detection module is configured to:

adjust the voltage of the reference power source in response to a detection instruction based on the plurality of reference voltages comprised in the reference voltage set; or if detecting that a physical parameter of a storage device meets a detection trigger condition, adjust the voltage of the reference power source based on the plurality of reference voltages comprised in the reference voltage set.

19. A storage device, comprising a storage controller and a storage medium, wherein the storage controller is connected to the storage medium by using an interface bus, wherein the storage controller is configured to:

adjust a voltage of a reference power source based on a plurality of reference voltages comprised in a reference voltage set;

adjust, based on a plurality of reference moments comprised in a reference moment set, a moment of an edge of a data strobe signal transmitted by a transmitting end of a data signal, wherein the transmitting end is the storage medium and before adjusting the moment of the edge of the data strobe signal, the storage controller writes test data to the storage medium at a target rate, transmits to the storage medium an instruction for reading the test data, and receives the data signal carrying the test data and the data strobe signal transmitted by the storage medium; and for each reference voltage and each reference moment, determine whether a bit error exists in data obtained by decoding the transmitted data signal when the voltage of the reference power source is the reference voltage and the moment of the edge of the data strobe signal is the reference moment, to obtain a timing margin of the data signal at each reference voltage and a voltage margin of the data signal at each reference moment, wherein the timing margin is a range of reference moments that enable the data obtained by decoding to be free of bit errors, in the plurality of reference moments, and the voltage margin is a range of reference voltages that enable the data obtained by decoding to be free of bit errors, in the plurality of reference voltages.

20. The storage device according to claim 19, wherein the receiving end comprises a register and a bleeder circuit, wherein a control end of the bleeder circuit is connected to the register, and wherein an output end of the bleeder circuit is connected to the reference power source; and wherein the storage device further comprises a detection module configured to:

adjust a value of the register, to adjust an output voltage of the bleeder circuit.

* * * * *